(12) United States Patent
Pedersen

(10) Patent No.: US 7,400,737 B2
(45) Date of Patent: Jul. 15, 2008

(54) MINIATURE CONDENSER MICROPHONE AND FABRICATION METHOD THEREFOR

(75) Inventor: Michael Pedersen, Bethesda, MD (US)

(73) Assignee: Corporation for National Research Initiatives, Reston, VA (US)

( * ) Notice: Subject to any disclaimer, the term of this patent is extended or adjusted under 35 U.S.C. 154(b) by 231 days.

(21) Appl. No.: 11/442,315

(22) Filed: May 30, 2006

(65) Prior Publication Data

US 2006/0215858 A1 Sep. 28, 2006

Related U.S. Application Data

(62) Division of application No. 10/302,839, filed on Nov. 25, 2002, now Pat. No. 7,146,016.

(60) Provisional application No. 60/333,125, filed on Nov. 27, 2001.

(51) Int. Cl.
*H04R 25/00* (2006.01)
*H04R 19/04* (2006.01)

(52) U.S. Cl. ................ 381/175; 381/356

(58) Field of Classification Search ........... 381/113, 381/116, 173, 174, 175, 182, 191, 355, 356, 381/369; 310/324; 367/163, 174, 178, 181; 438/53

See application file for complete search history.

(56) References Cited

U.S. PATENT DOCUMENTS

| | | |
|---|---|---|
| 3,118,022 A | 1/1964 | Sessler et al. |
| 4,910,840 A | 3/1990 | Sprenkels et al. |
| 5,208,789 A | 5/1993 | Ling |
| 5,303,210 A | 4/1994 | Bernstein |
| 5,408,731 A | 4/1995 | Berggvist et al. |
| 5,452,268 A * | 9/1995 | Bernstein .......... 381/191 |
| 5,490,220 A | 2/1996 | Loeppert |
| 5,677,965 A | 10/1997 | Moret et al. |
| 5,848,172 A | 12/1998 | Allen et al. |
| 5,870,482 A | 2/1999 | Loeppert et al. |
| 5,982,709 A | 11/1999 | Ladabaum et al. |
| 6,012,335 A | 1/2000 | Bashir et al. |
| 6,088,463 A | 7/2000 | Rombach et al. |
| 6,140,689 A | 10/2000 | Scheiter et al. |
| 6,243,474 B1 | 6/2001 | Tai et al. |
| 6,249,075 B1 | 6/2001 | Bishop et al. |

(Continued)

OTHER PUBLICATIONS

Modelling of Silicon Condenser Microphones, A.G.H. van der Donk, P.R. Scheeper, W. Olthuis and P. Bergveld, Sensors and Actuators A, 40, 1994, pp. 203-216.*

(Continued)

*Primary Examiner*—Brian Ensey
(74) *Attorney, Agent, or Firm*—Nixon & Vanderhye P.C.

(57) ABSTRACT

An acoustic pressure type sensor fabricated on a supporting substrate is disclosed. The acoustic sensor is fabricated by depositing and etching a number of thin films on the supporting substrate and by machining the supporting substrate. The resulting structure contains a pressure sensitive, electrically conductive diaphragm positioned at a distance from an electrically conductive fixed electrode. In operation, the diaphragm deflects in response to an acoustic pressure and the corresponding change of electrical capacitance between the diaphragm and the fixed electrode is detected using an electrical circuit. Two or more such acoustic sensors are combined on the same supporting substrate with an interaural flexible mechanical connection, to form a directional sensor with a small surface area.

27 Claims, 24 Drawing Sheets

U.S. PATENT DOCUMENTS

| | | | |
|---|---|---|---|
| 6,285,771 | B1 | 9/2001 | Killion et al. |
| 6,535,460 | B2 * | 3/2003 | Loeppert et al. ............ 367/181 |
| 7,146,016 | B2 | 12/2006 | Pedersen |
| 2002/0067663 | A1 | 6/2002 | Loeppert et al. |

OTHER PUBLICATIONS

A Review of Silicon Microphones, P.R. Scheeper, A.G.H. van der Donk, W. Olthuis and P. Bergveld, Sensors and Actuators A, 44, 1994, pp. 1-11.*

On the Electromechanical Behavoir of Thin Perforated Backplates in Silicon Condenser Microphones, M. Pederson, W. Olthuis and P. Bergveld, 8th International Conference on Solid-State Sensors and Actuators, and Eurosensors IX, Stockholm, Sweden, 234-A7, Jun. 25-29, 1995, pp. 13-16.*

A Silicon Condenser Microphone with Polyimide Diaphragm and Backplate, Micheal Pedersen, Wouter Olthuis and Piet Bergveld, Sensors and Actuators A, 63, 1997, pp. 97-104.*

Pedersen et al. "High Performance Condenser Microphone with Fully Integrated CMOS Amplifier and DC-DC Voltage Converter", Journal of Microelectromechanical Systems, vol. 7, (1998), pp. 387-394.

L.L. Beranek "Acoustics", Acoustical Society of America, 1996, pp. 149-150.

R.N.Miles et al. "Mechanically coupled ears for directional hearing in the parasitoid fly *Ormia ochracea*", Journal of the Acoustical Society of America, vol. 98 (1995), pp. 3059-3070.

R.N.Miles et al., "A silicon nitride microphone diaphragms inspired by the ears of the parasitoid fly *Ormia ochracea*".

Rudolf, F. and Bergquist, J.A. Silicon Condenser Microphone with A Highly Perforated Backplate, IEEE, 1991, pp. 266-269, especially p. 266.

International Search Report for International Application No. PCT/US02/37539, mailed Aug. 19, 2003.

* cited by examiner

FIG. 3a
(PRIOR ART)
FIG. 3b
(PRIOR ART)
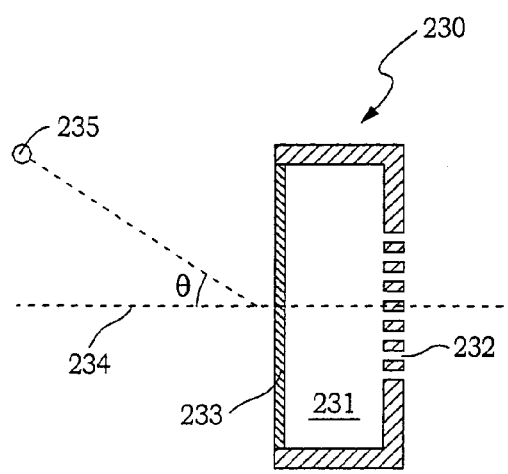
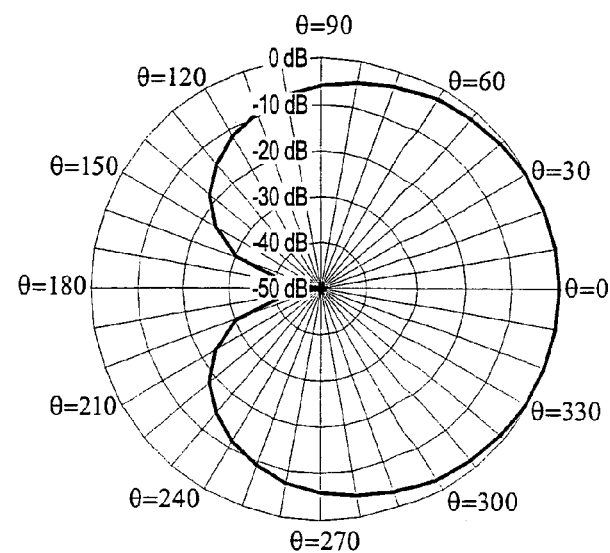
FIG. 4 (PRIOR ART)
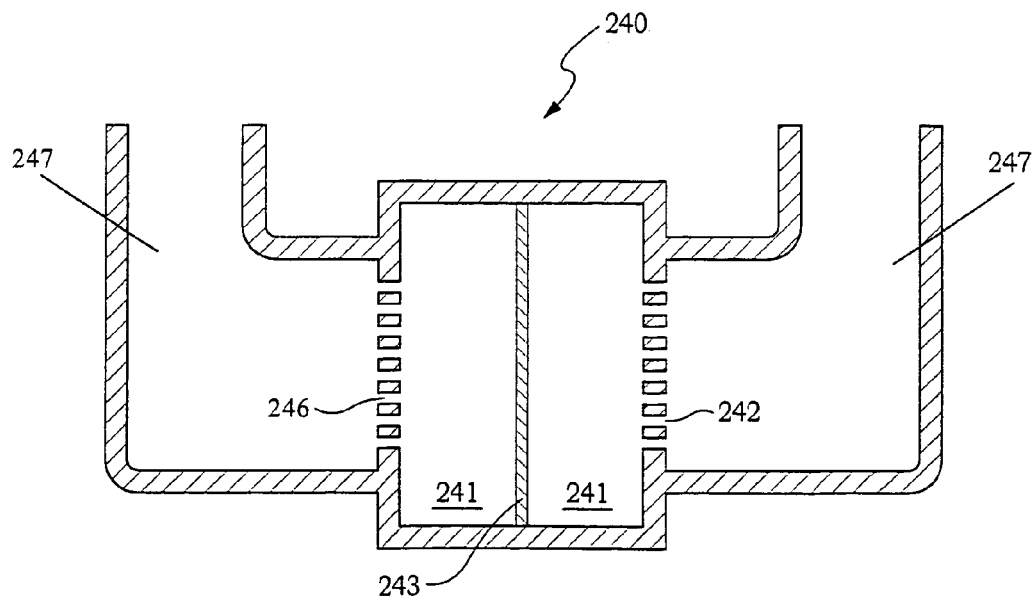

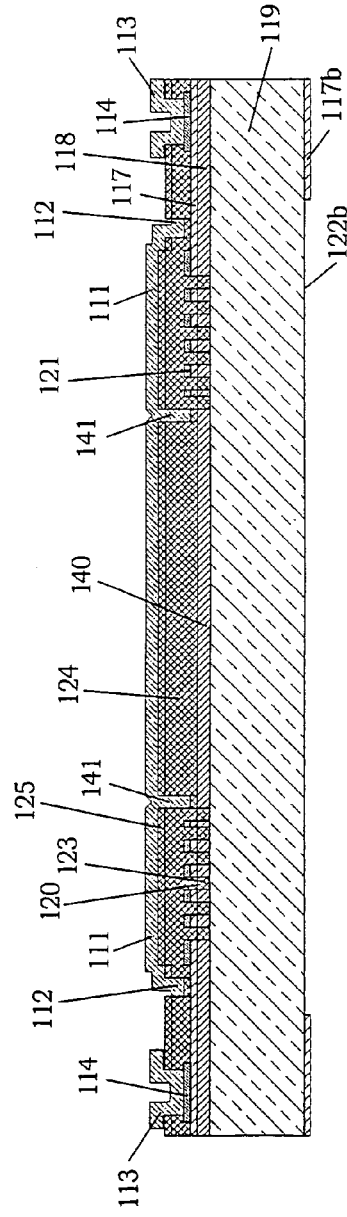
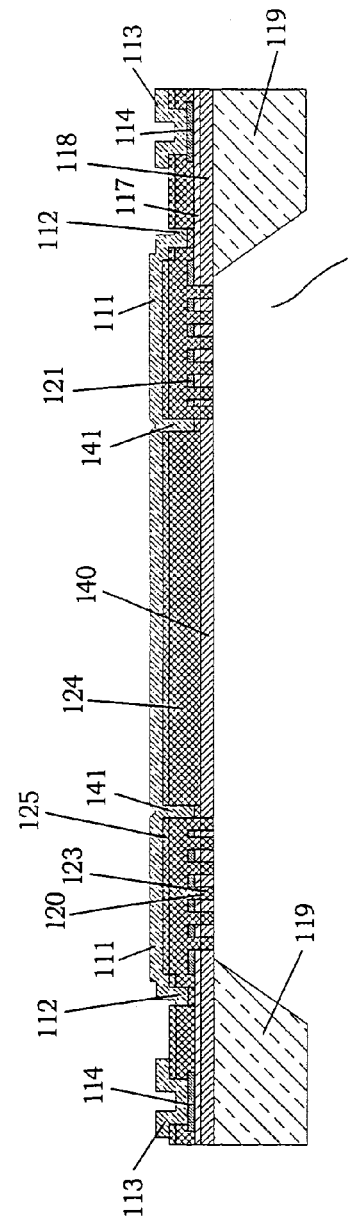
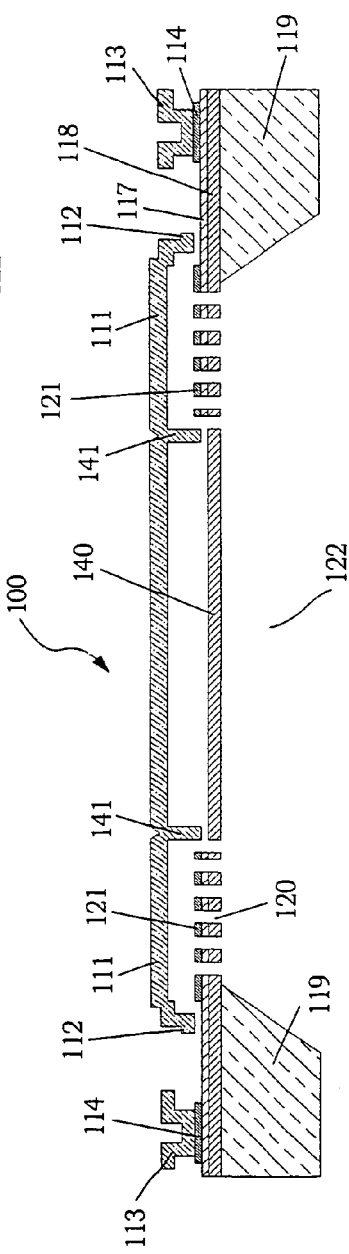

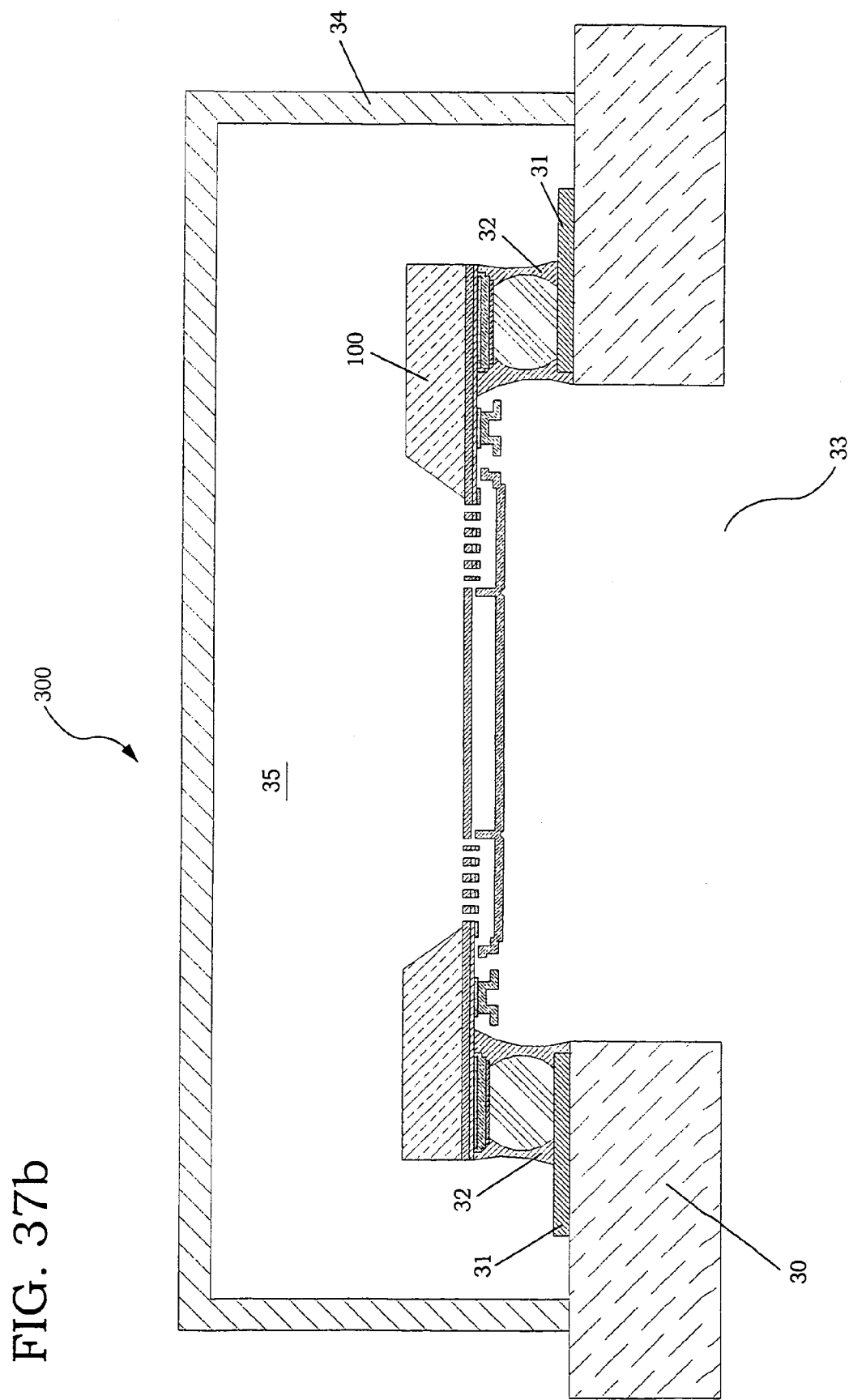

MINIATURE CONDENSER MICROPHONE AND FABRICATION METHOD THEREFOR

This application is a divisional of Application Ser. No. 10/302,839, filed Nov. 25, 2002, now U.S. Pat. No. 7,146,016 which claims the benefit of Provisional Application Ser. No. 60/333,125, filed Nov. 27, 2001, the entire contents of which are hereby incorporated by reference in this application.

FIELD OF THE INVENTION

The present invention relates to the field of acoustic transducers, and more specifically to a microfabricated airborne acoustic microphone using micro electro-mechanical systems (MEMS).

BACKGROUND OF THE INVENTION

The emergence of micro fabrication technology has led to a number of developments in the field of airborne acoustic sensors (microphones). Traditionally, the most common technology for microphones has been the use of an electret to detect a deflection of a diaphragm caused by a differential acoustic pressure. Electrets are insulators (such as Teflon or Mylar) on which an electrical charge is trapped. An electret is used in a microphone to produce the necessary electrical field in the air gap between the electrically conductive movable diaphragm and fixed electrode to detect the deflection of the diaphragm. Alternatively, a DC potential between the diaphragm and fixed electrode may be applied from an external source to create the electrical field. This latter device is referred to as a condenser microphone.

A common problem with electret microphones is leakage of electrical charge from the electret, which directly affects the sensitivity of the microphone. This problem is especially severe at elevated temperature and humidity levels. It is inherently difficult to protect the microphone, since it must be exposed to the environment to detect an acoustic signal. Condenser microphones do not suffer from this problem; however due to the large air gaps in devices made with traditional fabrication methods, the external DC potentials required are in the order of hundreds of Volts, which is difficult to realize in battery powered systems.

With the utilization of micro fabrication technology, it is possible to significantly reduce the dimensions, including the air gap, of a microphone. With micro fabrication technology, condenser microphone structures can be fabricated which only require an external DC potential of 5-20 Volts. There are several key motivations for the development of MEMS microphones, the most important of which are: improvement of device ruggedness in system assemblies, miniaturization, improvement of performance and manufacturability of existing devices, and potential monolithic integration with semiconductor electronics.

An important limiting parameter for the performance, specifically sensitivity, of micro fabricated microphones is the mechanical sensitivity of the diaphragm in the device. As the device is scaled down, the microphone sensitivity increases linearly as the air gap decreases, but this is counteracted by a decrease which goes to the fourth power of the diaphragm size. The mechanical sensitivity of the diaphragm is determined by the material properties (such as Young's modulus and Poisson's ratio), thickness, and any intrinsic stress in the diaphragm. It is therefore very important to maximize the diaphragm sensitivity by making it very thin and with a minimal amount of intrinsic stress. In micro fabrication, it is difficult to control the intrinsic stress levels in materials, hence special attention is required to solve this problem. In the prior art, the stress problem has been addressed by using low-stress materials, such as single crystal silicon, polycrystalline silicon and silicon germanium for the diaphragm. Alternatively, the intrinsic stress can be relieved by creating a compliant suspension between the diaphragm and the supporting substrate, which allows the diaphragm to expand and contract.

The idea of suspension is attractive, since it will not only allow relief of any intrinsic stress in the diaphragm, but also decouple the diaphragm from any stress induced due to mismatch of thermal expansion between the diaphragm and the substrate, as well as any stress stemming from the mounting of the substrate in a package. There is, however, some undesirable features associated with prior art devices.

One prior art microphone device 210 shown in FIG. 1 contains a diaphragm 211 supported by four or more springs 212, which are all formed from a silicon substrate 213. However, to realize springs 212 and diaphragm 211, a number of slots 214 must be etched in diaphragm 211, which leads to an acoustical bypass, or leakage, of diaphragm 211. As a result, the low-frequency roll-off of microphone 210 is directly determined by these slots, the dimensions of which are difficult to control. Furthermore, since the motion of diaphragm 211 is set by the stiffness of suspension springs 212, it is important to control tightly the physical dimensions of these springs.

An alternative microphone device 220 shown in FIG. 2 is a variation of the design in which the diaphragm 221 is suspended in a single point 222 (see FIG. 2) or along a straight line around which diaphragm 221 can freely expand or contract. Since the air gap in this type of structure not only defines the distance between movable diaphragm 221 and the fixed counter electrode 223, but also the acoustical leakage resistance in the device it must be tightly controlled. As the diaphragm in this device is essentially a cantilever with one end fixed and the other end free to move, any intrinsic stress gradient in the diaphragm material will cause diaphragm 221 to bend, leading to a change of the air gap in the device, and therefore, the sensitivity and roll-off frequency. This problem is especially important if the diaphragm is composed of more than one material, which may induce a stress gradient by mismatch of thermal expansion in the different materials. Therefore, to realize a suspended diaphragm structure such as that shown in FIG. 2, precise control of dimensions and material stress gradients is required. In another prior art design without suspension in which the diaphragm is loosely confined between the substrate and a lateral restraint, there is no suspension force to release the diaphragm from the substrate, and thus, it is important to avoid stiction in the device during the release of the diaphragm. Unfortunately, surface forces and associated stiction is a predominant effect in micro fabrication due to the extremely smooth surfaces in the device.

Microphones with directional properties are desirable in many applications to lower background noise levels and, in some systems, to enable determination of sound source location. A fundamental limitation on the directivity of a single pressure type microphone is that the size of the sound detecting diaphragm must be comparable to the wavelength of the sound of interest to achieve significant directivity. For human speech and hearing, which is centered around a wavelength of approximately 156 mm, this requires diaphragms of unrealistic sizes. Alternatively, as shown in FIG. 3a, a pressure type microphone 230 can be combined with a pressure gradient microphone in a single structure to achieve a directional response. Such microphones are known as first order gradient microphones. By carefully adjusting the volume of the air cavity 231, the acoustic resistance through the screen 232, and the acoustical path length from the front of the diaphragm 233 to the screen 232, a directivity pattern known as a cardioid pattern can be achieved (see FIG. 3b). The directivity pattern is depicted for a sound source location 235 at the angle θ from a principal direction 234. Microphone 230 has maximum response on the principal axis 234 of microphone 230 and a null response at ±180° from principal axis 234, the principal axis being perpendicular to diaphragm 233. The condition which must be met to achieve the cardioid pattern shown in FIG. 3b is given by:

$$\Delta l = c C_A R_A,$$

where $\Delta l$ is the acoustical path between diaphragm 233 and screen 232, c is the speed of sound in air (344 m/s), $C_A$ is the acoustical compliance of the air cavity 231, and $R_A$ is the acoustical resistance of screen 232. For very small devices, it is difficult and costly to manufacture screen material with high enough acoustical resistance to meet the condition above. Secondly, since the lower roll-off frequency of the microphone is given approximately by:

$$f_{low} = \frac{1}{2\pi R_A C_A} = \frac{c}{2\pi \Delta l},$$

the lower roll-off frequency of microphone 230 increases as the exterior dimensions decrease. As a result, most first order gradient directional microphones have a sloped frequency response, since in most cases the frequency of interest for detection is smaller than the roll-off frequency. Such microphones are typically referred to as having a ski-slope response.

A common method employed to improve the frequency response of a directional microphone is to increase the effective acoustical path $\Delta l$ by design of the microphone package. FIG. 4 shows a microphone package 240 with two air cavities 241 in which acoustical inlets 242 and 246 for the front and back of the microphone diaphragm 243 are further separated by tubes 247 mounted on the microphone package. The microphone shown in FIG. 3a employs only one damping screen 232; however, if a second damping screen 246 is added in front of diaphragm 243, the frequency response can be leveled when compared to the structure of FIG. 3a with one damping screen. The device of FIG. 4 has symmetric acoustic paths and resistances on both sides of single diaphragm 243.

Another approach to achieve directivity is to implement a so-called second order gradient (SOG) microphone, in which the difference in arrival time of the incoming acoustic wave is enhanced by electronic or acoustical means. The principal idea of the SOG microphone is illustrated in FIG. 5 and FIG. 6. In FIG. 5, the typical electronic implementation of an SOG microphone is shown with an array 250 of four omni directional microphones 251, and a complex summing network 252. A specific time delay τ and τ' is added electronically to the microphone signals and the signals are subtracted in the network 252. As a result, the output signal 253 of summing network 252 is the sum of the signal from microphone M1 and the signal from microphone M4 delayed by τ+τ' minus the sum of the signal from microphone M2 delayed by τ' and the signal from microphone M3 delayed by τ. If τ and τ' are chosen such that τ=2τ', the delays will make the microphone array 250 behave as if the distance between each microphone is increased by c*τ' where c is the speed of sound in air (344 m/s). In other words, a small array can be made to behave like a larger array, with better directivity, by adding delays to each microphone signal. The disadvantages of adding electronic delays are the number of external components needed to realize the functionality, and the need for finely tuned and matched microphones in the array.

It is also possible to achieve the desired delay by acoustical means. Such an implementation is shown in FIG. 6, in which a first order gradient microphone 261 is connected to acoustic paths 262-265 of different lengths which has openings 266-269 with impedance matched acoustic resistances. In operation, the acoustic paths 262-265 act as delay lines, and by adjusting the length of the paths, a directional response similar to the electronic system of FIG. 5 can be realized. A common drawback of all approaches described above is the relative bulkiness of the devices, which does not lend itself well to miniaturization due to fundamental limitations in the underlying physics upon which these devices are based.

An alternative detection principle has been found in nature in auditory organs of the *Ormia ochracea* parasitoid fly. This insect uses hearing to locate sounds produced by crickets, and has been shown to possess a remarkable directional hearing ability. An impressive feat considering the distance between the eardrums in the insect is only approximately 2% of the wavelength of the sound of interest (4.8 kHz). It has been shown that complex interaction between the two eardrums through mechanical coupling greatly enhances the directional response of each eardrum. A single diaphragm solution with properties similar to the second order mechanical system of the hearing organs in the fly has been suggested in the prior art. The single diaphragm contains a number of corrugations to create resonance modes similar to the dominant vibration modes in the hearing organs of the fly. Unfortunately, the micro fabrication of a single diaphragm with these properties is difficult and problems with stress and stress gradients in the diaphragm material, leading to intrinsic curling and deflection, complicates the matter in a similar fashion as described earlier.

SUMMARY OF THE INVENTION

It is therefore an object of the present invention to provide an acoustic transducer with a suspended diaphragm which has a good low-frequency response and in which the suspension structure has little or no influence on the sensitivity of the device.

It is another object of the present invention to minimize the influence of stiction on the performance of said acoustical transducer.

It is a further object of the present invention to provide such an acoustic transducer in which the sensitivity to stress gradients in the diaphragm material is minimal.

It is another object of the present invention to provide a batch fabrication process for the acoustic transducer that can be performed using micro machining processes.

It is yet a further object of the present invention to provide a fabrication process with a minimal number of layers and masks to reduce the fabrication cost.

It is still another object of the present invention to provide a fabrication process that will allow the mechanical coupling of two or more such acoustic transducers to realize a directional acoustic transducer.

It is still a further object of the present invention to provide a directional acoustic transducer in which the response is designed and optimized for human communication.

The present invention results from the realization that, by preventing the suspension structure from controlling the movement of the diaphragm in response to an applied sound pressure, it is possible to eliminate the dependency of the microphone performance on the exact stiffness, and hence dimensional variation, of the suspension structure. Furthermore, if a suspension structure is used which has a restoring force equal to or greater than the surface contact forces in the device, problems associated with stiction can be greatly reduced. A second important realization is that an acoustic seal can be created by utilizing the electrostatic force generated between the diaphragm and fixed counter electrode during operation of the microphone, thereby improving the low-frequency performance of the microphone over other suspended diaphragm structures in the prior art. A third important realization is that by providing for a mechanical flexible connection between two or more such diaphragms, a microphone with directional response may be realized.

The present invention comprises a fixed counter electrode formed on a supporting substrate and a diaphragm attached to said supporting substrate by a number of suspension structures. The diaphragm contains an annular indentation along the periphery, which serves to provide a predefined standoff between the diaphragm and the fixed counter electrode when an external DC bias voltage is applied. It also provides an acoustic seal between the front and back of the diaphragm to enable low frequency acoustical response of the diaphragm. The fixed counter electrode contains a number of holes to allow the air in the gap between the fixed electrode and the diaphragm to escape, thereby reducing the acoustical damping in the device. The suspension structure is designed, such that the restoring force overcomes any surface forces from the mechanical contact in the device. In operation, an electrical bias voltage is applied between the fixed counter electrode and the conductive diaphragm, or conductive layer on the diaphragm, to establish an electrical field in the air gap. The electrostatic force associated with the electrical field overcomes the restoring force of the suspension structure, causing the diaphragm to be pulled towards the supporting substrate. The diaphragm makes physical contact with the supporting substrate at the annular indentation, which sets the initial operational air gap in the microphone. An incident sound pressure wave will produce a pressure differential over the diaphragm, causing it to deflect from its initial position. The change in electrical capacitance between the diaphragm and fixed counter electrode is detected with an electronic circuit. The detection circuit may be integrated in the supporting substrate.

The present invention also comprises the combination of two or more such microphones on a single supporting substrate, in which the diaphragms are mechanically connected by a centrally supported beam formed in the supporting substrate. In operation, an incoming sound pressure wave will produce a pressure differential on each of the diaphragms, causing them to deflect from their initial state. However, due to the mechanical connection between the diaphragms, the force from the acoustic pressure on each diaphragm is transferred to the other diaphragm(s). If the incoming sound pressure wave is completely in phase on all diaphragms, there will be a condition of force balance in the system, and the compliance of the mechanical beam will determine the deflection of the diaphragms. If the detected incoming sound pressure waves are not in phase, which is the case if the sound source is not located on the principal axis of the microphone, the mechanical interaction between the diaphragms and the mechanical coupling beam will determine the response of each diaphragm. The compliance of the diaphragms and the mechanical coupling beam must be adjusted together with the acoustic damping of the diaphragms to achieve the desired frequency and directional response of the microphone. The acoustic damping of the diaphragms is determined by the height of the operational air gap and the size and density of holes in the fixed counter electrodes.

BRIEF DESCRIPTION OF DRAWINGS

FIGS. 3a and 3b are a conceptual view and a directional response curve of a first order gradient microphone with a single damping screen.

FIG. 4 is a conceptual view of a prior art first order gradient microphone with damping screens on both sides of the diaphragm.

FIGS. 23 through 34 are cross-sectional views of a directional microphone structure according to the present invention at different stages of the fabrication process used to make such microphone.

FIG. 37b is a cross-sectional view of a directional microphone structure assembled on to a package carrier substrate according to the present invention.

DETAILED DESCRIPTION OF THE PREFERRED EMBODIMENT

Figure 1:
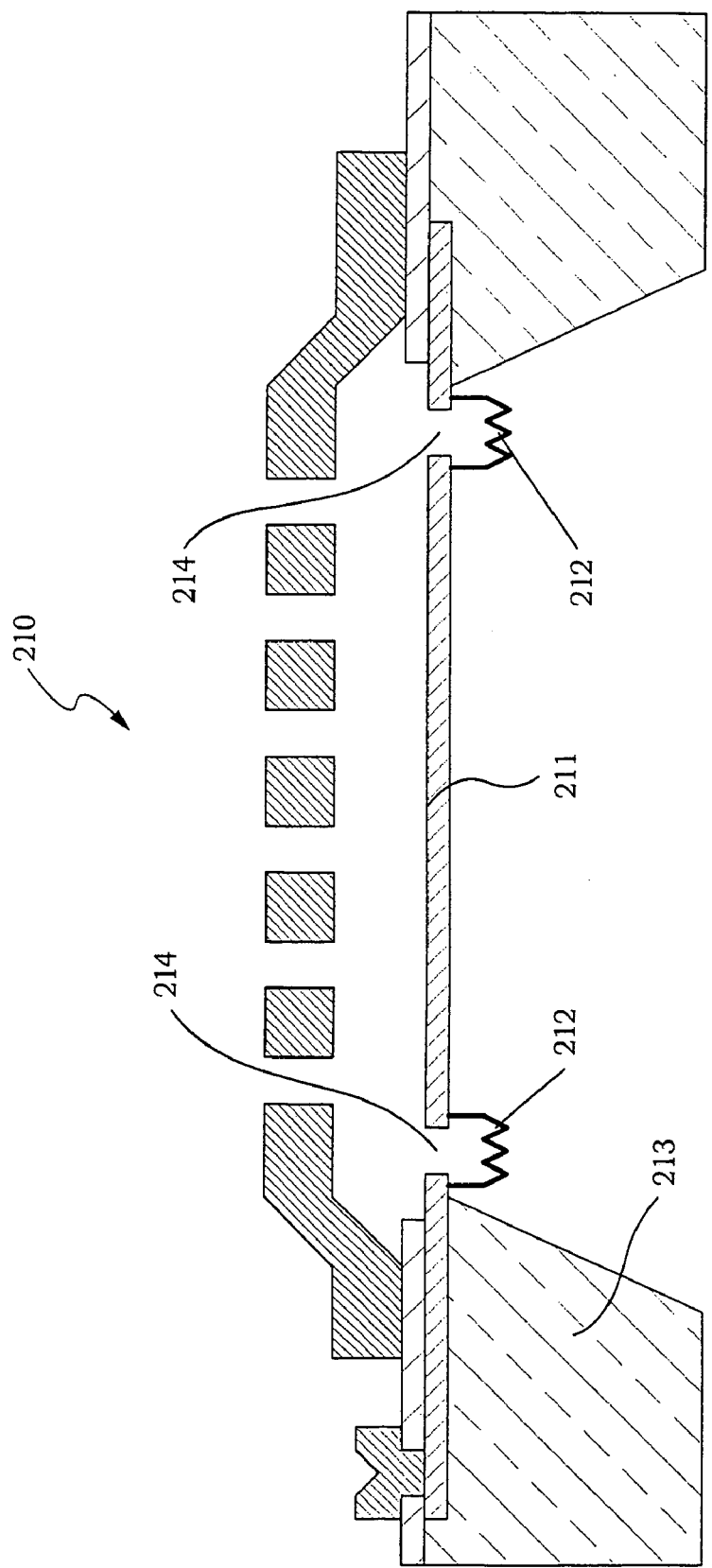
FIG. 1 is a cross-sectional view of a prior art microphone with a suspended diaphragm.
Figure 2:
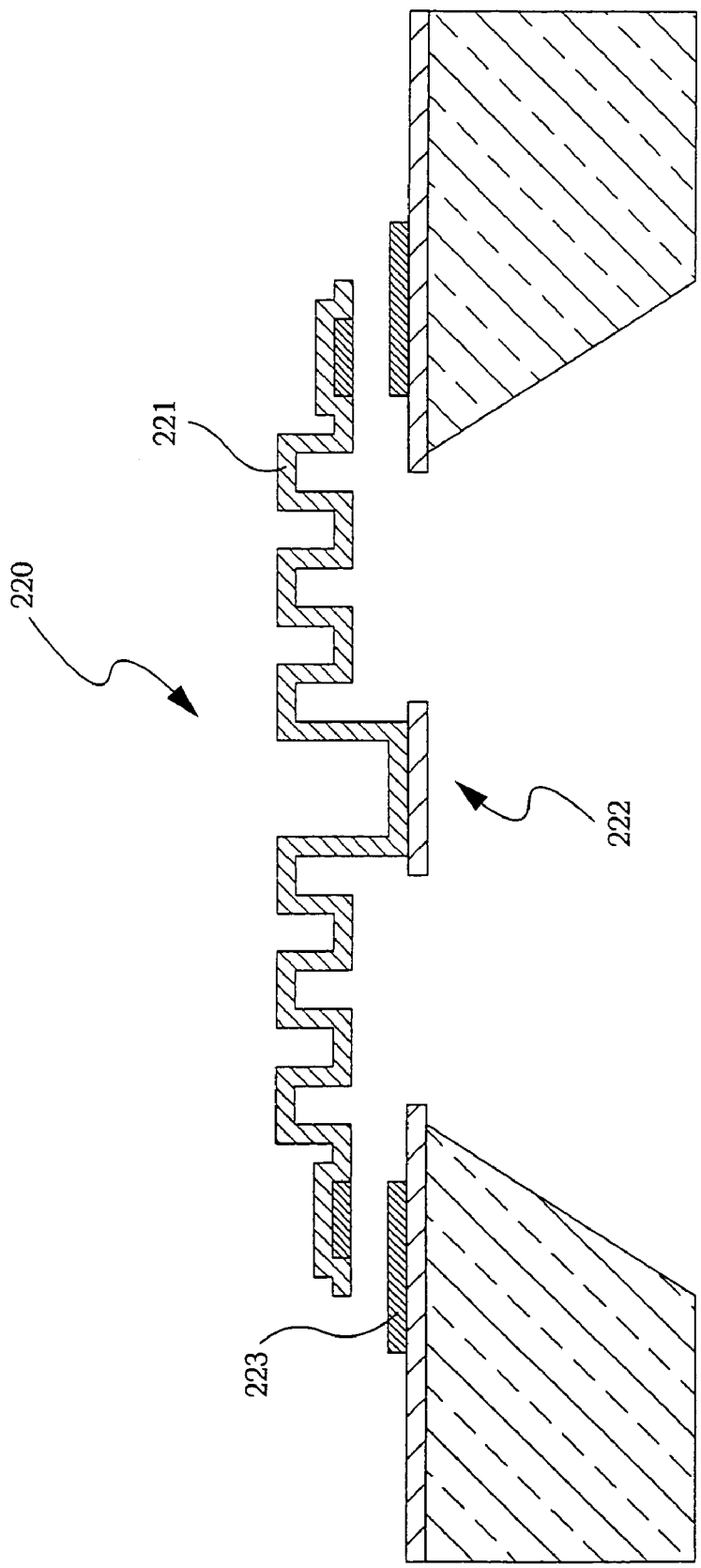
FIG. 2 is a cross-sectional view of a prior art microphone with a diaphragm suspended in a single central point.
Figure 5:
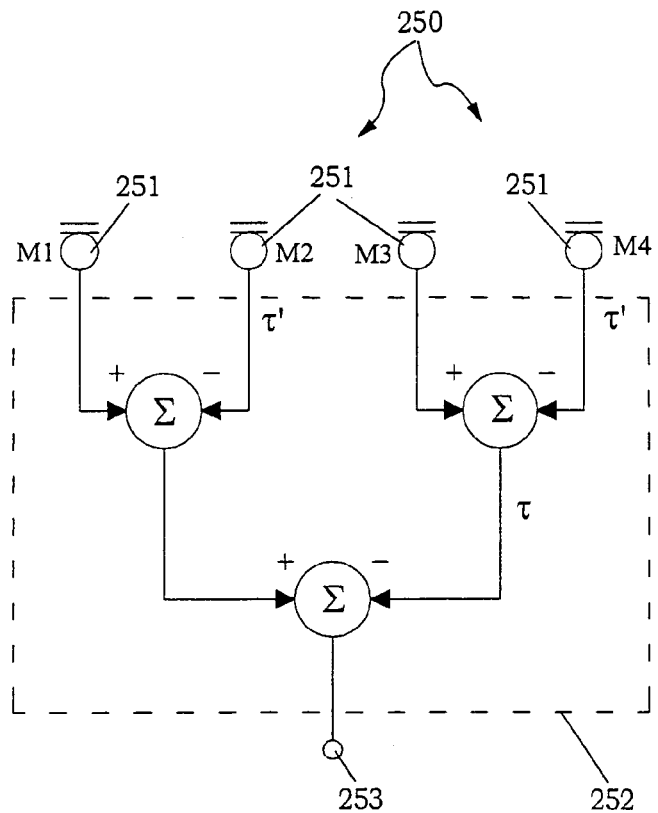
FIG. 5 is a functional diagram of a prior art second order gradient microphone with electronic time delays.
Figure 6:
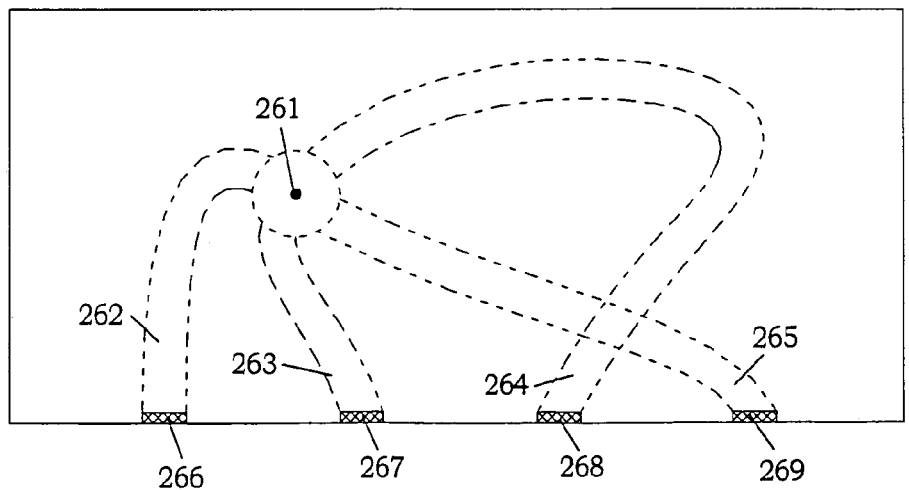
FIG. 6 is a top plan view of a prior art second order gradient microphone with acoustical delay lines.
Figure 7:
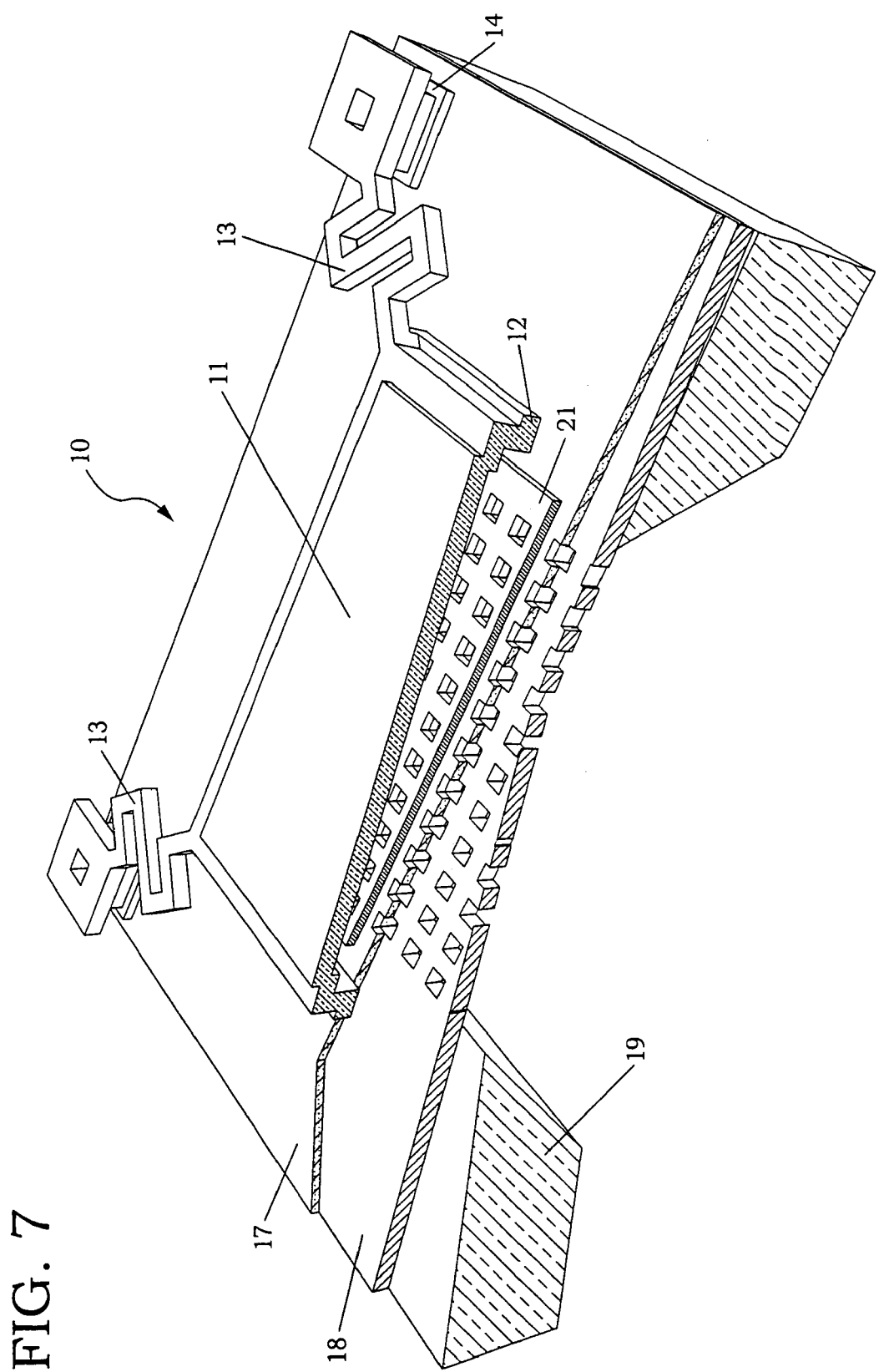
FIG. 7 is a perspective view of a microphone structure according to the present invention partially cut away.
Figure 8:
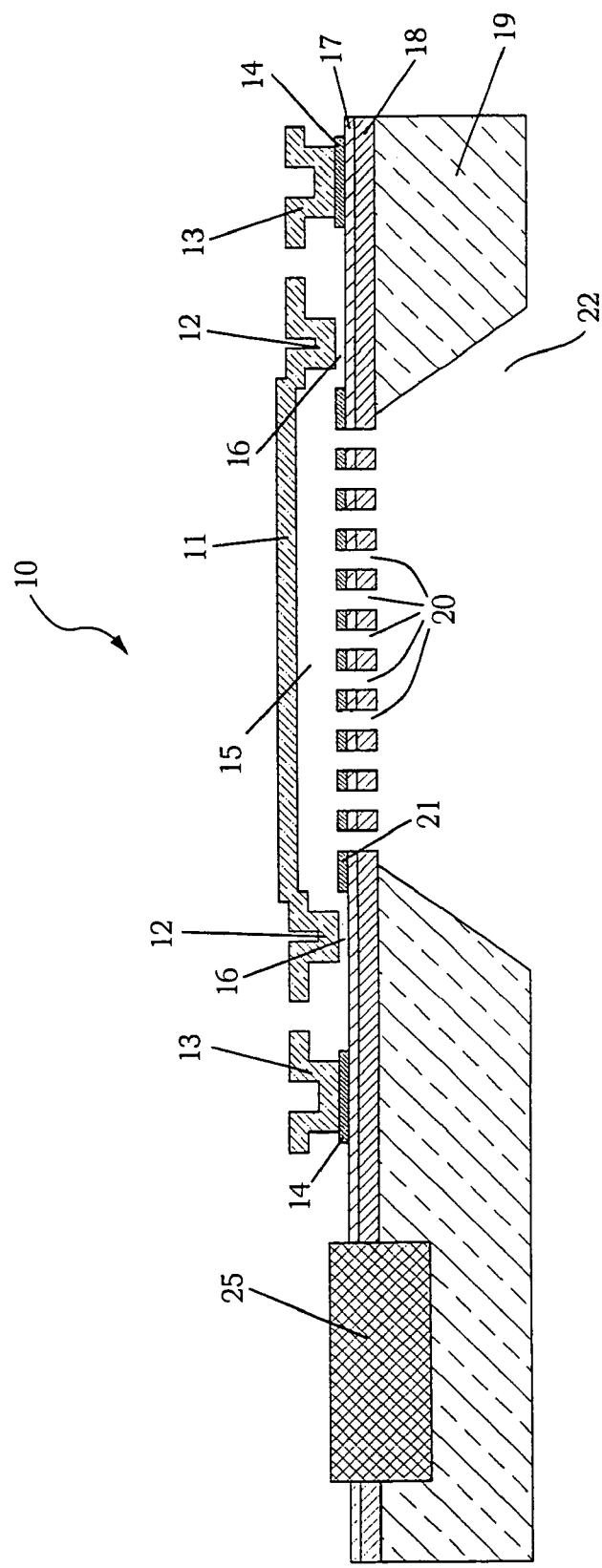
FIG. 8 is a cross-sectional view of the microphone structure of FIG. 7 according to the present invention.

One embodiment of the microphone structure 10 according to the present invention is shown in the perspective view of FIG. 7 and the cross-sectional view of FIG. 8. An electrically conductive diaphragm 11 is attached to a supporting substrate 19 by a number of flexible suspension structures 13. Conductive diaphragm 11 can be a single layer conductive material, or be comprised of several layers of which at least one is conductive. Suspension structures 13 are attached to supporting substrate 19 using a conducting anchor material 14. Diaphragm 11 contains an annular indentation 12 at the perimeter, which in the initial position forms a narrow air gap 16 with supporting substrate 19. Supporting substrate 19 is coated with an electrically insulating layer 17, which isolates the conductive diaphragm 11 and a fixed counter electrode. A fixed counter electrode 21 is made of conductive layer 14, insulator 17, and a bulk layer 18. The purpose of bulk layer 18 is to provide sufficient mechanical rigidity to fixed counter electrode 21. A number of openings 20 are made in fixed counter electrode 21 to allow the air in the gap 15 to escape when diaphragm 11 deflects in response to an acoustical sound pressure. An electronic detection circuit 25 may be formed on substrate 19 before, during, or after the formation of microphone structure 10.

In operation, an electrical DC bias voltage of 1V to 20V is applied between conductive diaphragm 11 and conductive layer 14 on the fixed counter electrode 21 from an external voltage source. The resulting electrostatic attraction force between diaphragm 11 and fixed counter electrode 21 causes diaphragm 11 to deflect at the suspension points 13 until diaphragm 11 makes mechanical contact with supporting substrate 19, and the narrow gap 16 is closed. Once gap 16 is closed, suspension structures 13 do not deflect further and any additional load (i.e. sound pressure) on the diaphragm will cause it to deflect within annular boundary 12. The deflection can be detected as a change of capacitance between diaphragm 11 and fixed counter electrode 21.

Figure 9:
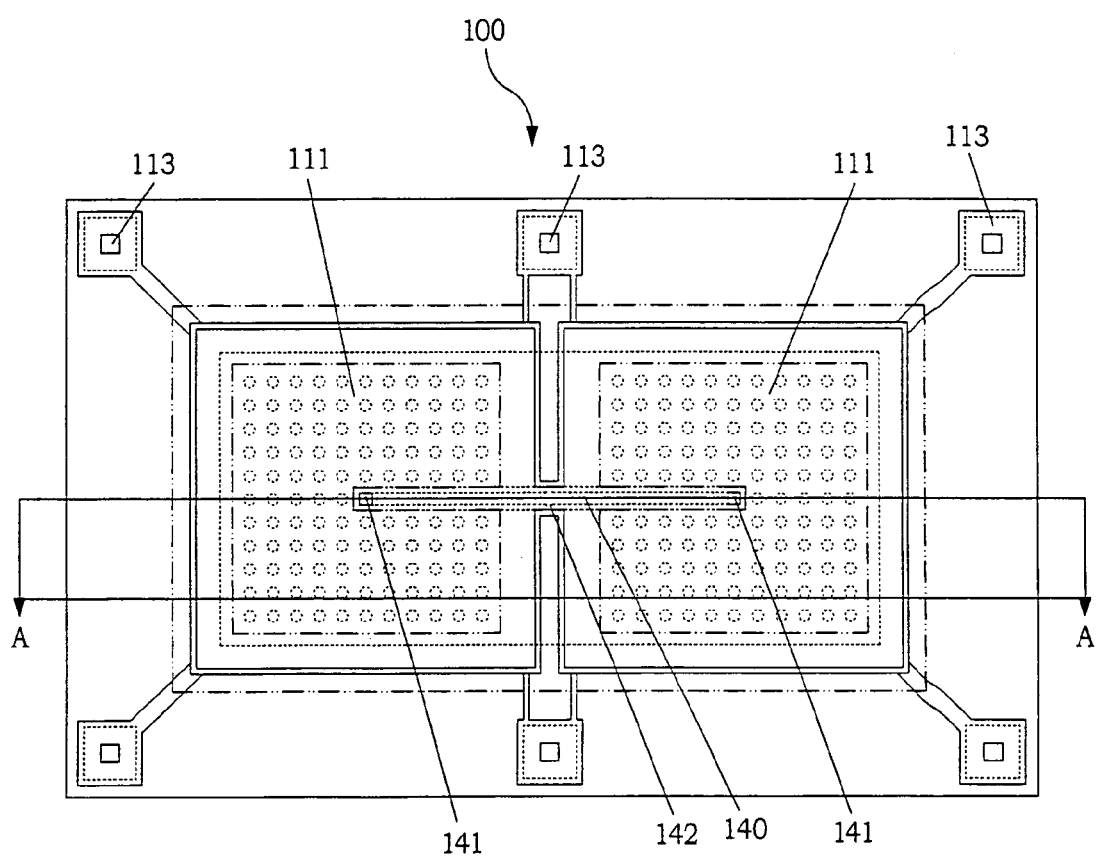
FIG. 9 is a top plan view of a directional microphone structure according to the present invention.
Figures 10, 11, 12:
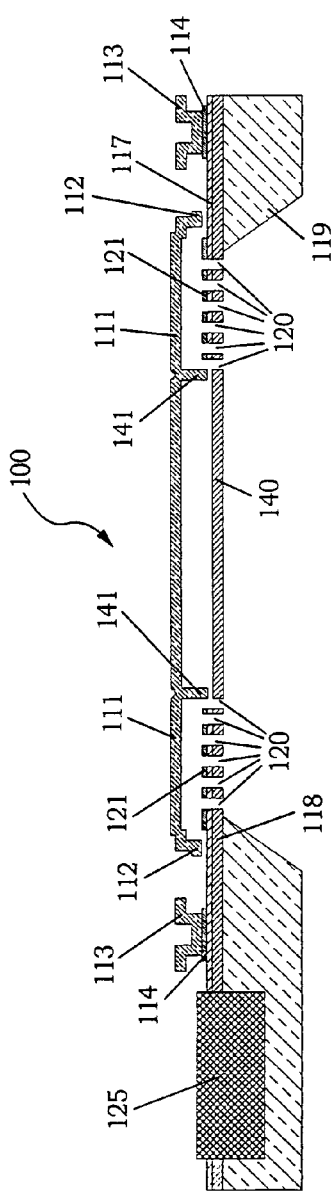
FIG. 10 is a cross-sectional view of a directional microphone according to the present invention taken along the section line A-A in FIG. 9.
FIGS. 11 through 22 are cross-sectional views of a microphone structure according to the present invention at different stages of the fabrication process used to make such microphone.

An embodiment of a directional microphone 100 according to the present invention is shown in top plan view in FIG. 9 and cross-sectional view in FIG. 10. In this embodiment, two diaphragms 111 are combined on a single supporting substrate 119. Each diaphragm 111 has features as described above for microphone structure 10, including mechanical attachment springs 113, annular indentation 112, fixed counter electrode 121, acoustic vent holes 120, electrically insulating layer 117, and bulk layer 118. In addition, an indentation 141, with the same height as annular indentation 112, is formed in each diaphragm, and a mechanical coupling beam 140 is formed in the bulk layer 118. Mechanical coupling beam 140 is attached to substrate 119 at the torsional points 142, allowing beam 140 to swivel out of the plane of substrate 119. An electronic detection circuit 125 may be formed on substrate 19 before, during, or after the formation of directional microphone structure 100.

In operation, an electrical DC bias voltage of 1V to 20V is applied between each diaphragm 111 and fixed counter electrode 121. The resulting electrostatic attraction forces causes each diaphragm to be pulled towards substrate 119 until the annular indentations 112 make mechanical contact with substrate 119. At the same time, indentations 141 will make mechanical contact at each end of mechanical coupling beam 140. The diaphragms 111 are in this situation coupled mechanically through beam 140. When an incident sound pressure wave is applied, the deflection of each diaphragm is governed by the dynamic behavior of the mechanical coupling, leading to a directional response of each diaphragm.

A preferred fabrication process for the microphone structure 10 according to the present invention is shown in FIG. 11 to 22. Firstly, as shown in FIG. 11, a bulk layer 18 is formed on a substrate 19. A preferred method for forming bulk layer 18 is to perform a diffusion of boron in a silicon substrate, forming a region in the substrate in which the boron concentration is higher than $5*10^{19}$ atoms/$cm^3$. A second preferred method for forming bulk layer 18 is epitaxial growth of a doped silicon layer on a silicon substrate, in which the boron concentration in the grown layer is higher than $5*10^{19}$ atomns/$cm^3$. A third preferred method for forming bulk layer 18 is the use of silicon on insulator (SOI) substrates.

Figure 13:
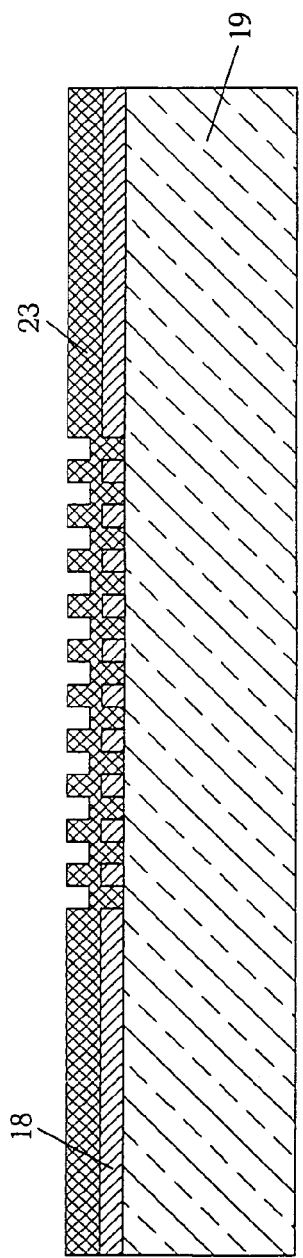
Figure 14:
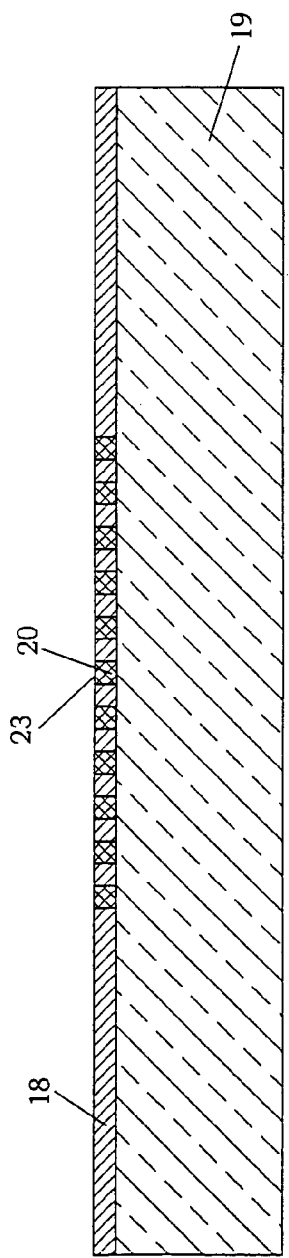
Figure 15:
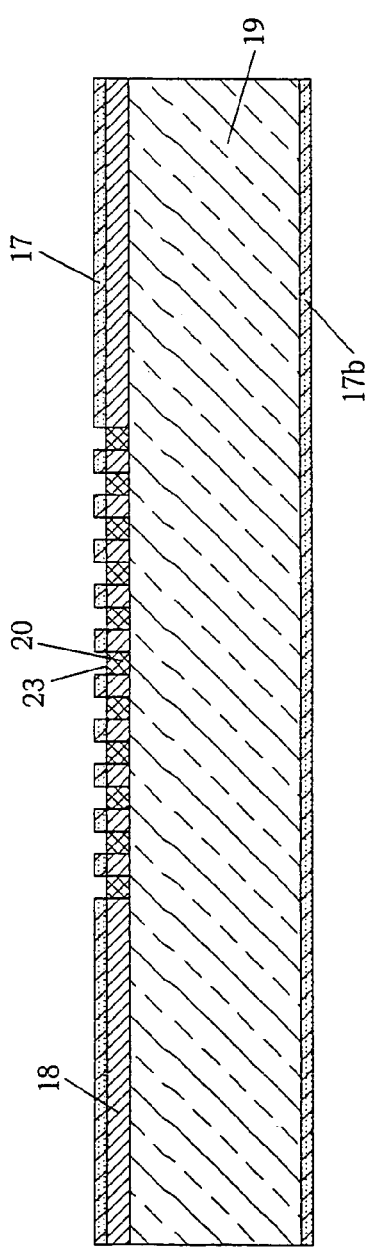
Figure 16:
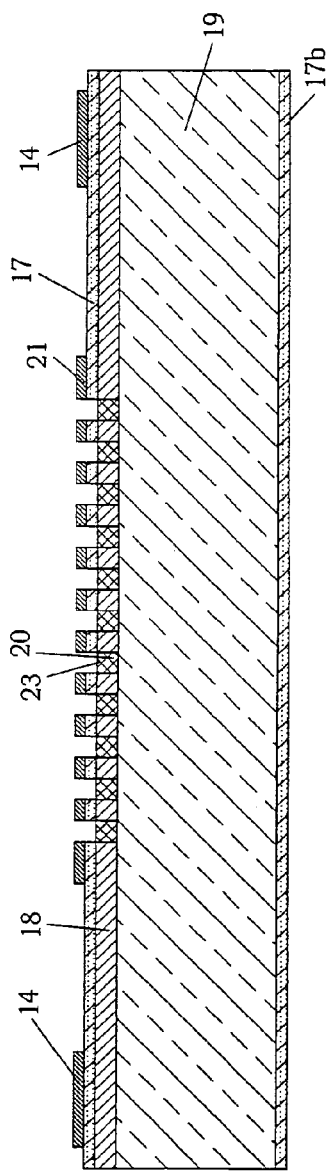
Figure 17:
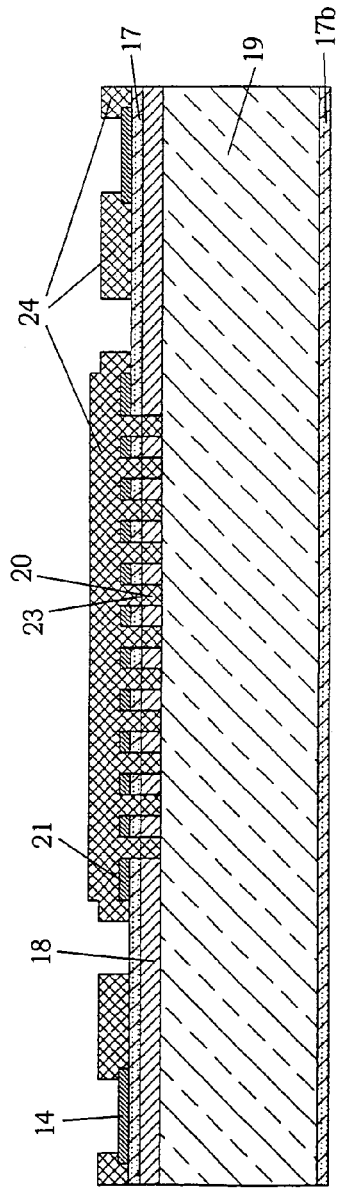
Figure 18:
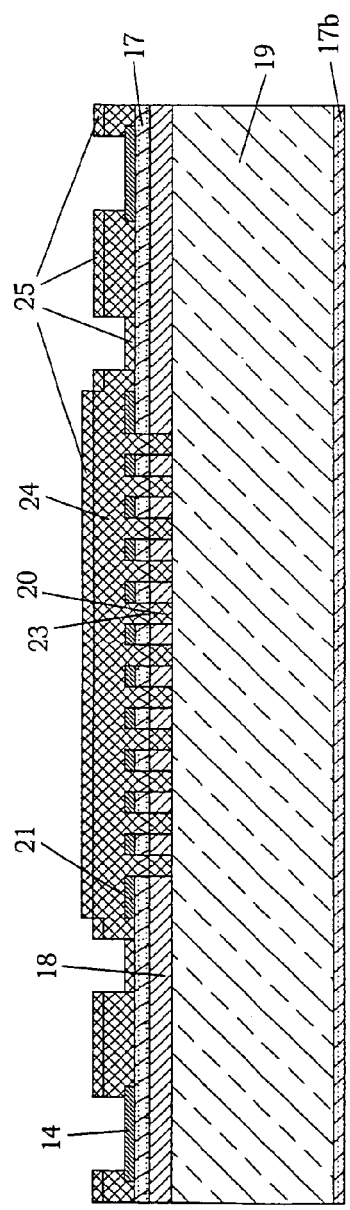

Subsequently, as shown in FIG. 12, substrate 19 is etched to form a number of cavities 20 in bulk layer 18. Substrate 19 is then covered with sacrificial material 23 as shown in FIG. 13, which covers all surfaces and fills out cavities 20. Preferred sacrificial materials include phosphosilicate glass (PSG) and silicon germanium alloy. Sacrificial layer 23 is then thinned down on the substrate using a planarization method, as shown in FIG. 14. A preferred method of planarization is chemical mechanical polishing (CMP). The planarization is performed until the original surface of bulk layer 18 reappears, leaving cavities 20 filled with sacrificial material 23. Referring now to FIG. 15, an electrically insulating layer is subsequently deposited on both sides of the substrate. The layer 17 on the side of substrate 19 with cavities 20 is patterned in a similar pattern as cavities 20. The layer 17b on the opposite side of substrate 19 is left intact for later use as an etch mask. A preferred material for electrically insulating layers 17 and 17b is silicon nitride. In FIG. 16, an electrically conductive layer 14 is then deposited and patterned to form the fixed counter electrode 21 and the anchor points 14 for suspended diaphragm 11. Preferred materials for electrically conductive layer 14 include low resistivity polycrystalline silicon, formed by the addition of a dopant, and silicon germanium alloy. In FIG. 17, a second sacrificial layer 24 is deposited and patterned, the thickness of which sets the operational air gap in the microphone structure of FIGS. 7 and 8. Preferred materials for second sacrificial layer 24 include phosphosilicate glass (PSG) and silicon germanium alloy. Second sacrificial layer is removed only in the diaphragm anchor areas 14 and the area of the annular indentation 12 of the diaphragm. In FIG. 18, a third sacrificial layer 25 is deposited and patterned, the thickness of which sets the initial gap between the supporting substrate 19 and the annular indentation 12. Preferred materials for the third sacrificial layer include phosphosilicate glass (PSG) and silicon germanium alloy. The third sacrificial layer is removed only in the diaphragm anchor areas 14.

Figure 19:
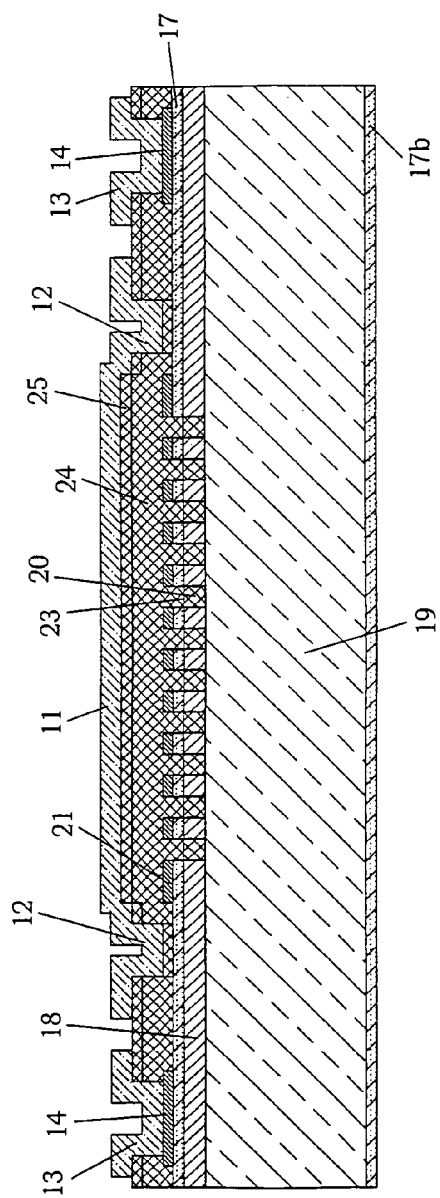
Figure 20:
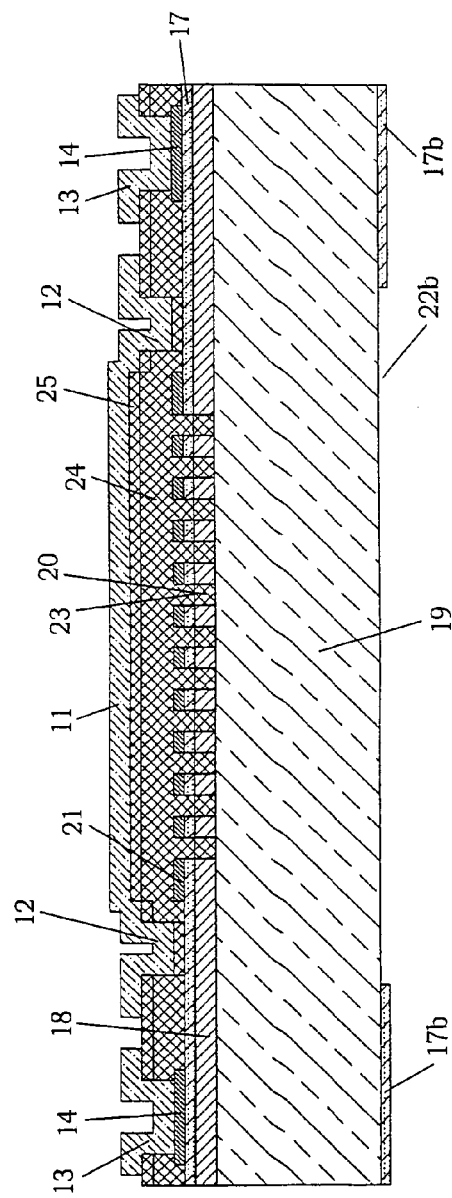
Figure 21:
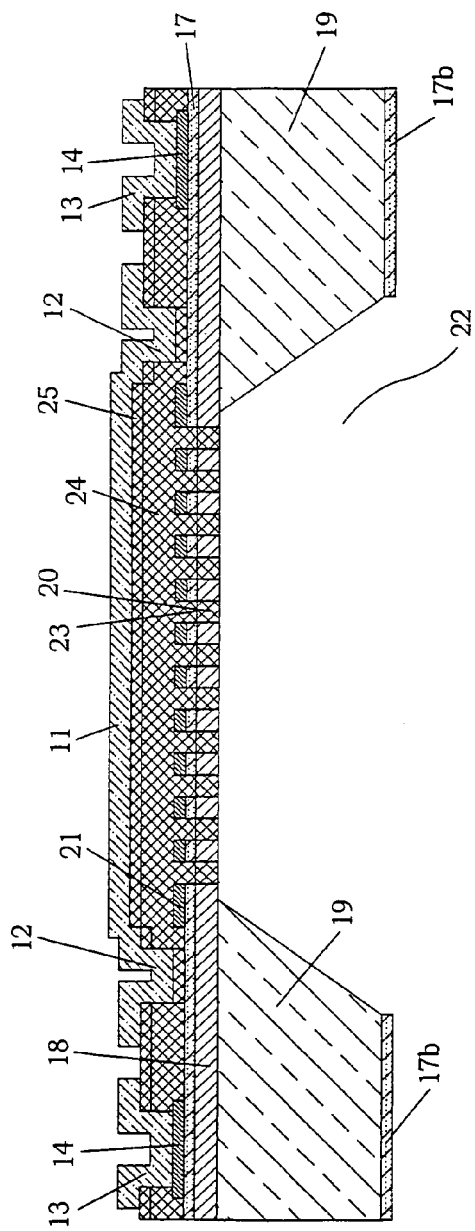
Figure 22:
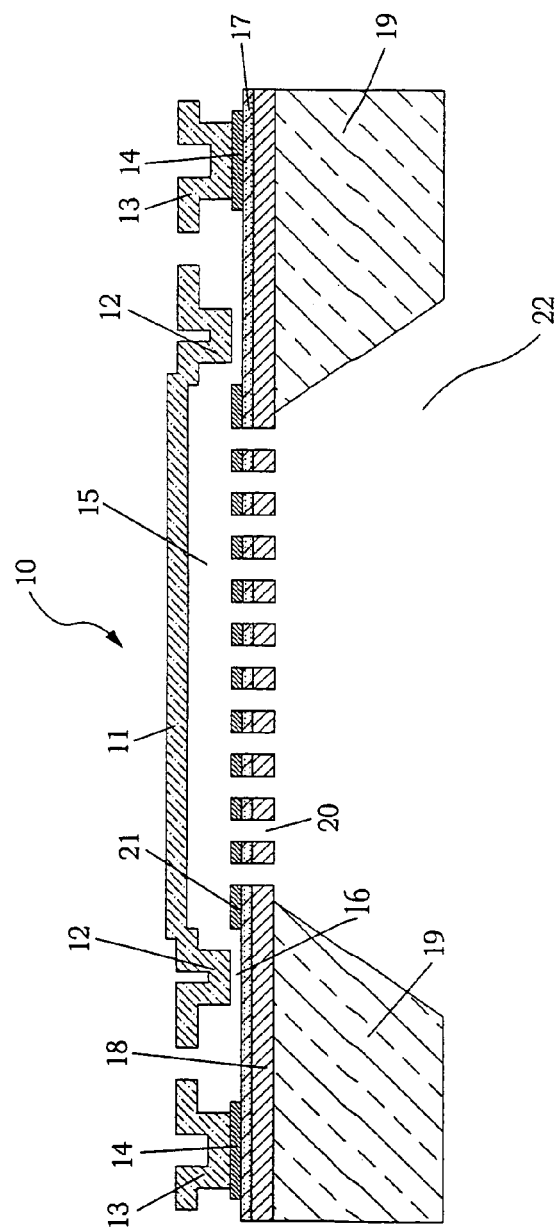

As shown in FIG. 19, an electrically conductive layer is deposited and patterned to form the diaphragm 11 with annular indentation 12 and suspension structures 13. It is desirable to use only one material to form diaphragm 11 to minimize curling or warping of the free structure due to stress gradients caused by mismatch of thermal expansion between layers. It is therefore also important that the single material has little or no intrinsic stress and stress gradient. Preferred materials for diaphragm 11 and suspension structures 13 include low resistivity polycrystalline silicon, formed by the addition of a dopant, and silicon germanium alloy. In FIG. 20, layer 17b on the opposite side of substrate 19 is then patterned to form an opening 22b, and substrate 19 is etched through to form the cavity 22. A preferred method to etch substrate 19 is a chemical solution of water and potassium hydroxide (KOH), which has the advantage of etching substrate 19 but not the preferred bulk layer 18 or sacrificial layers 23, 24, and 25. Therefore, the etching through substrate 19 has a natural termination and does not have to be closely monitored or controlled. A second preferred method to etch substrate 19 is anisotropic reactive ion etching. Finally, the sacrificial layers are removed by wet chemical etching to realize the complete microphone structure 10. A preferred wet etchant for phosphosilicate glass (PSG) sacrificial layers is hydrofluoric acid (HF). A preferred wet etchant for silicon germanium alloy is hydrogen peroxide.

Figure 23:
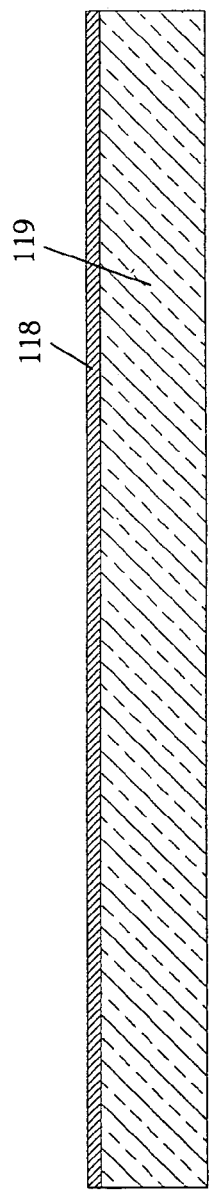
Figure 24:
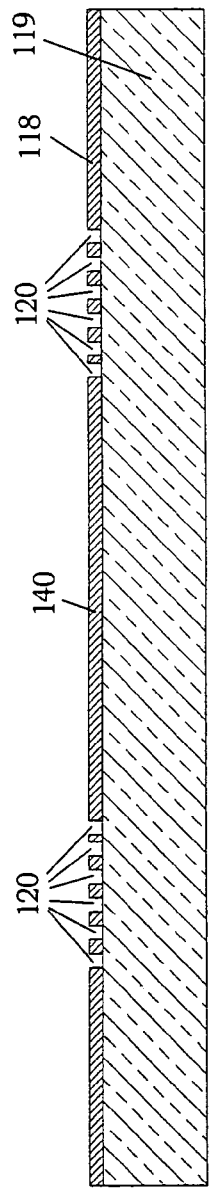
Figure 25:
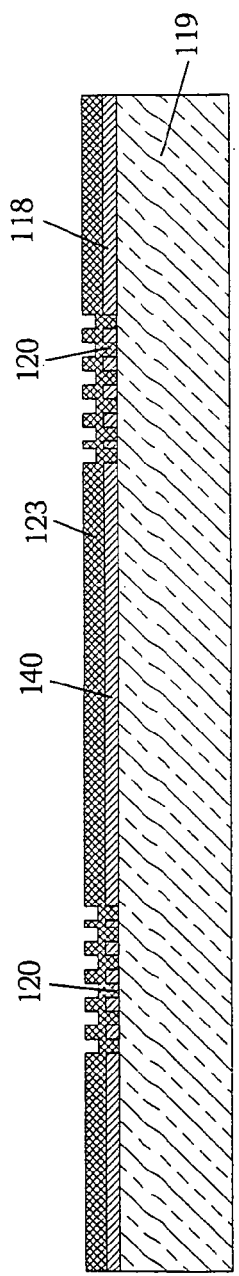
Figure 26:
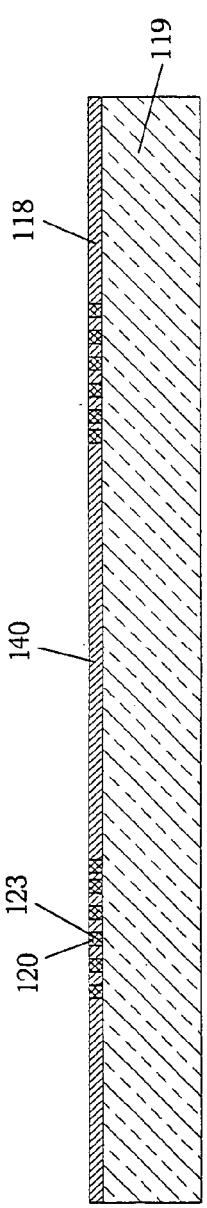
Figure 27:
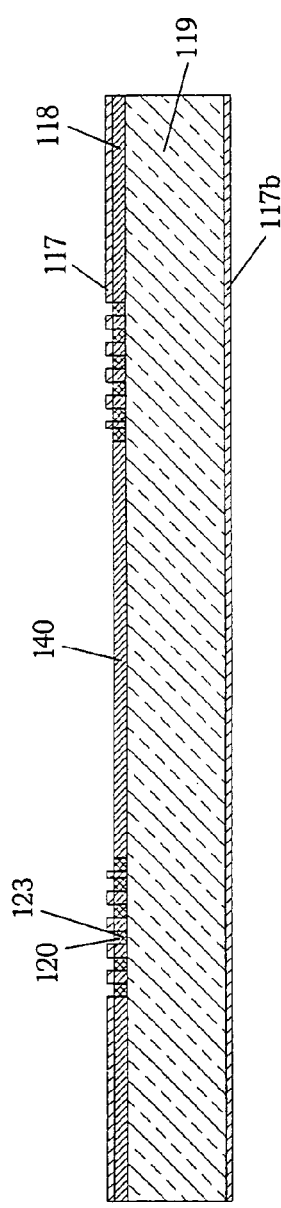
Figure 28:
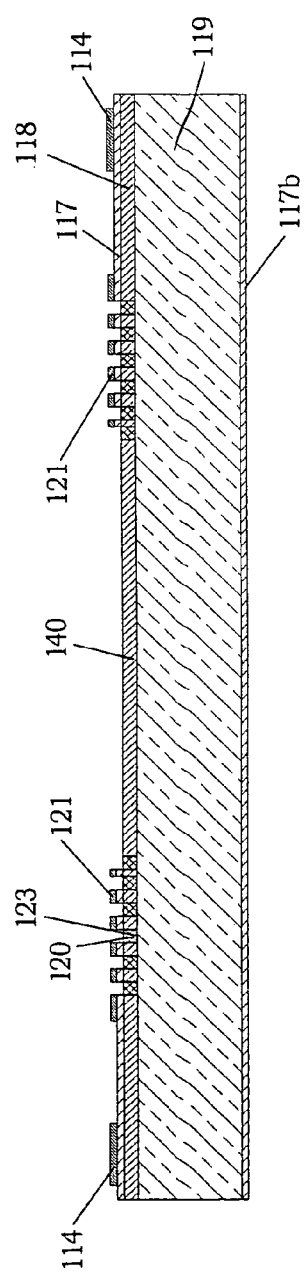
Figure 29:
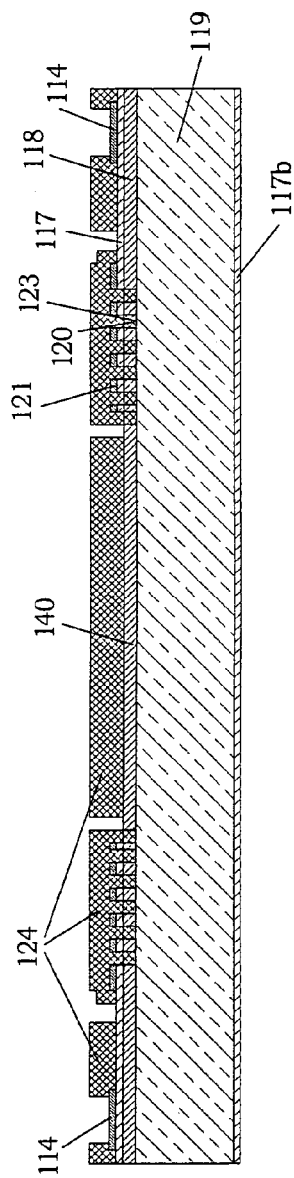
Figure 30:
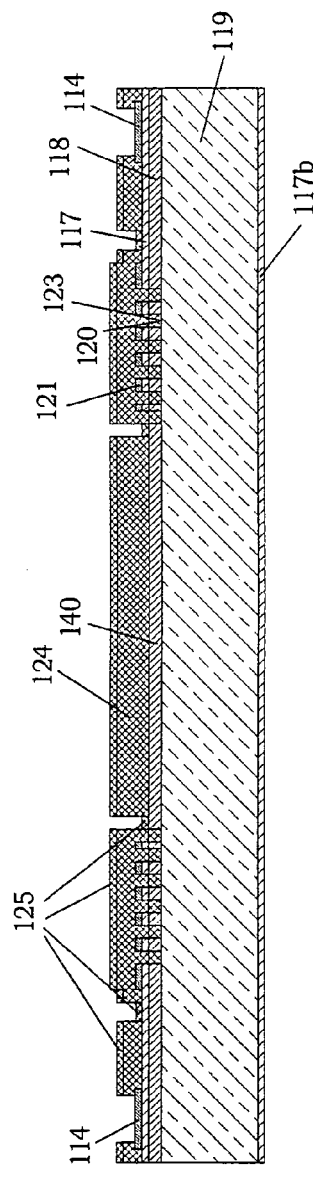
Figure 31:
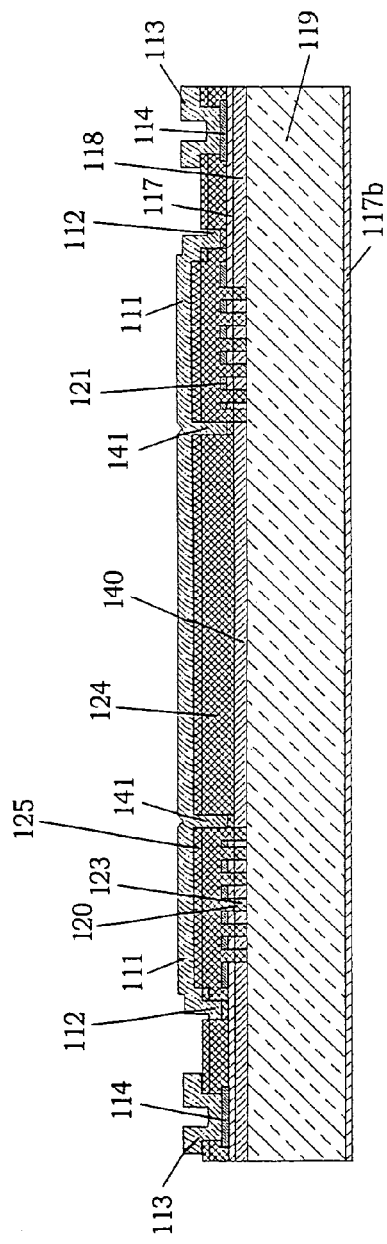

A preferred fabrication process for the directional microphone structure 100 according to the present invention is shown in FIGS. 23 to 34. As shown in FIG. 23, a bulk layer 118 is formed on a substrate 119 first. A preferred method for forming bulk layer 118 is to perform a diffusion of boron in a silicon substrate, forming a region in the substrate in which the boron concentration is higher than 5*10ô19 atoms/cmô3. A second preferred method for the formation of the bulk layer is epitaxial growth of a doped silicon layer on a silicon substrate, in which the boron concentration in the grown layer is higher than 5*10ô19 atoms/cmô3. A third preferred method for the formation of the bulk layer is the use of silicon on insulator (SOI) substrates. In FIG. 24, substrate 119 is etched to form a number of cavities 120 in bulk layer 118. Cavities 120 are also etched to form the mechanical coupling beam 140 and torsional attachment points 142. In FIG. 25, substrate 119 is then covered with a sacrificial material 123, which covers all surfaces and fills out cavities 120. Preferred sacrificial materials include phosphosilicate glass (PSG) and silicon germanium alloy. In FIG. 26, sacrificial layer 123 is then thinned down on substrate 119 using a planarization method. A preferred method of planarization is chemical mechanical polishing (CMP). The planarization is performed until the original surface of bulk layer 118 reappears, leaving the cavities filled with sacrificial material. As shown in FIG. 27, an electrically insulating layer is subsequently deposited on both sides of substrate 119. The layer 117 on the side of substrate 119 with cavities 120 is patterned in a similar pattern as cavities 120. The layer 117b on the opposite side of substrate 119 is left intact for later use as an etch mask. A preferred material for the electrically insulating layer is silicon nitride. In FIG. 28, an electrically conductive layer is then deposited and patterned to form fixed counter electrodes 121 and anchor points 114 for suspended diaphragms 111. Preferred materials for the electrically conductive layer include low resistivity polycrystalline silicon, formed by the addition of a dopant, and silicon germanium alloy. Then, as shown in FIG. 29, a second sacrificial layer 124 is deposited and patterned, the thickness of which sets the operational air gaps in the microphone structure 100. Preferred materials for the second sacrificial layer include phosphosilicate glass (PSG) and silicon germanium alloy. The second sacrificial layer is removed only in the diaphragm anchor areas 114 and the area of the annular and central indentations 112 and 141 of diaphragms 111. In FIG. 30, a third sacrificial layer 125 is deposited and patterned, the thickness of which sets the initial gap between the supporting substrate 119 and the annular and central indentations 112 and 141. Preferred materials for the third sacrificial layer include phosphosilicate glass (PSG) and silicon germanium alloy. The third sacrificial layer is removed only in the diaphragm anchor areas 114. In FIG. 31, an electrically conductive layer is deposited and patterned to form the diaphragms 111, with annular indentations 112 and indentations 141, and suspension structures 113. It is desirable to use only one material to form the diaphragm to minimize curling or warping of the free structure due to stress gradients caused by mismatch of thermal expansion between layers. It is therefore also important that the single material has little or no intrinsic stress and stress gradient. Preferred materials for the diaphragm and suspension structures 111 and 113 include low resistivity polycrystalline silicon, formed by the addition of a dopant, and silicon germanium alloy. In FIG. 32, the layer 117b on the opposite side of substrate 119 is then patterned to form an opening 122b, and in FIG. 33, substrate 119 is etched through to form the cavity 122. A preferred method to etch substrate 119 is a chemical solution of water and potassium hydroxide (KOH), which has the advantage of etching the substrate but not the preferred bulk layer or sacrificial layers. Therefore, the etching through substrate 119 has a natural termination and does not have to be closely monitored or controlled. A second preferred method to etch substrate 119 is anisotropic reactive ion etching. Finally, in FIG. 34, sacrificial layers 123, 124 and 125 are removed by wet chemical etching to realize the complete microphone structure 100. A preferred wet etchant for phosphosilicate glass (PSG) sacrificial layers is hydrofluoric acid (HF). A preferred wet etchant for silicon germanium alloy is hydrogen peroxide.

Figure 35:
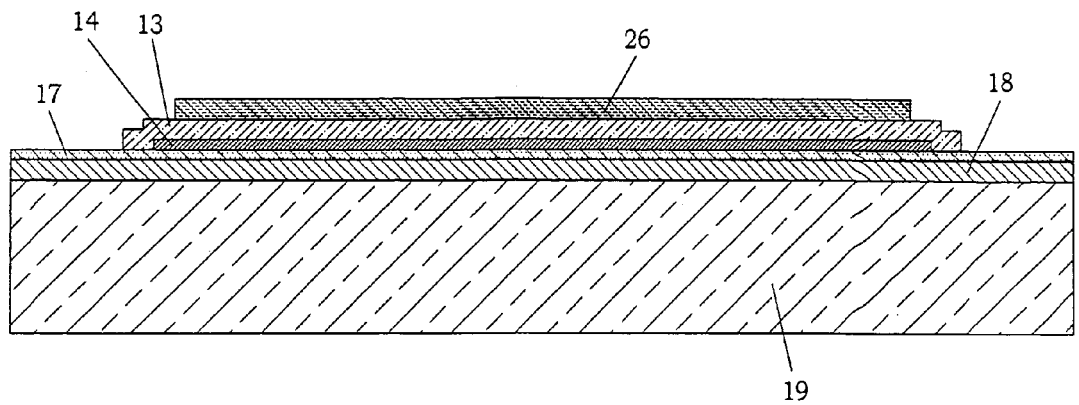
FIG. 35 is a cross-sectional view of an interconnection pad according to the present invention.
Figure 36:
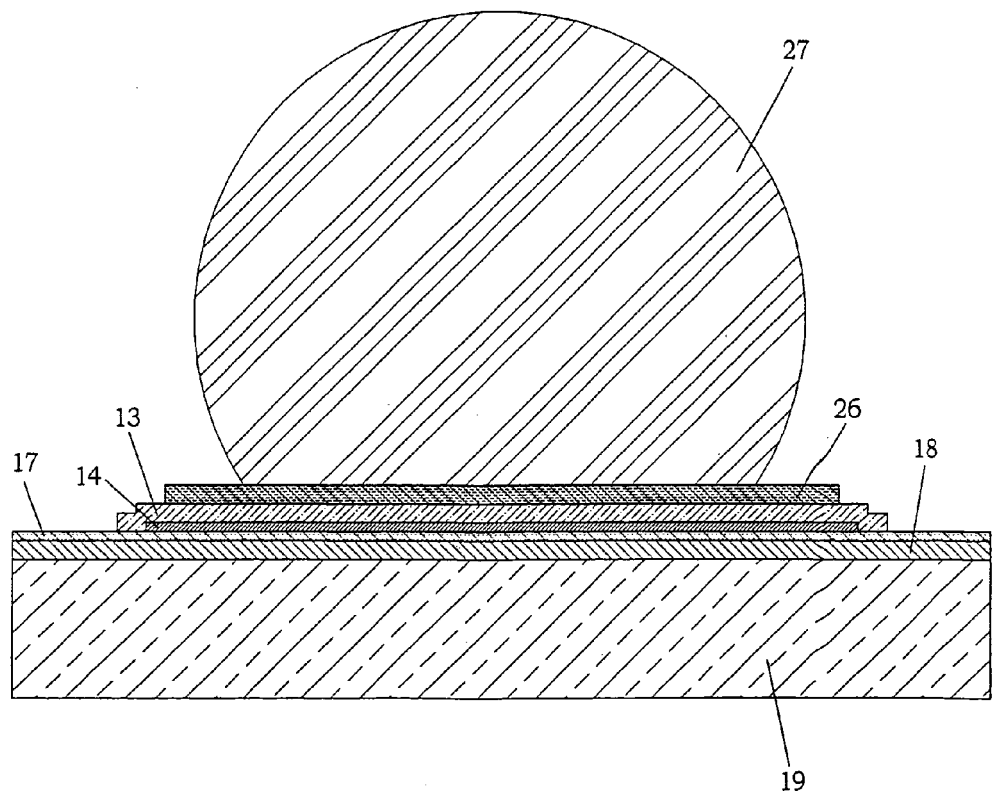
FIG. 36 is a cross-sectional view of an interconnection pad with a solder ball for flip-chip assembly according to the present invention.

Before the removal of sacrificial layers 23, 24 and 25 in microphone structure 10 or sacrificial layers 123, 124 and 125 in directional microphone structure 100, a metal may be deposited and patterned to form electrical connection pads 26, as shown in FIG. 35. A preferred metal for connection pads 26 is gold. In addition, as illustrated in FIG. 36, a solder ball 27 may be formed on each metal connection pad 26 to facilitate the use of flip-chip bonding methods for the assembly of the microphone substrate into a package. Preferred methods for the formation of solder balls include ball bonding, ball printing, and ball plating. Flip-chip bonding is especially useful to realize a flat rugged package for the microphone.

Figure 37A:
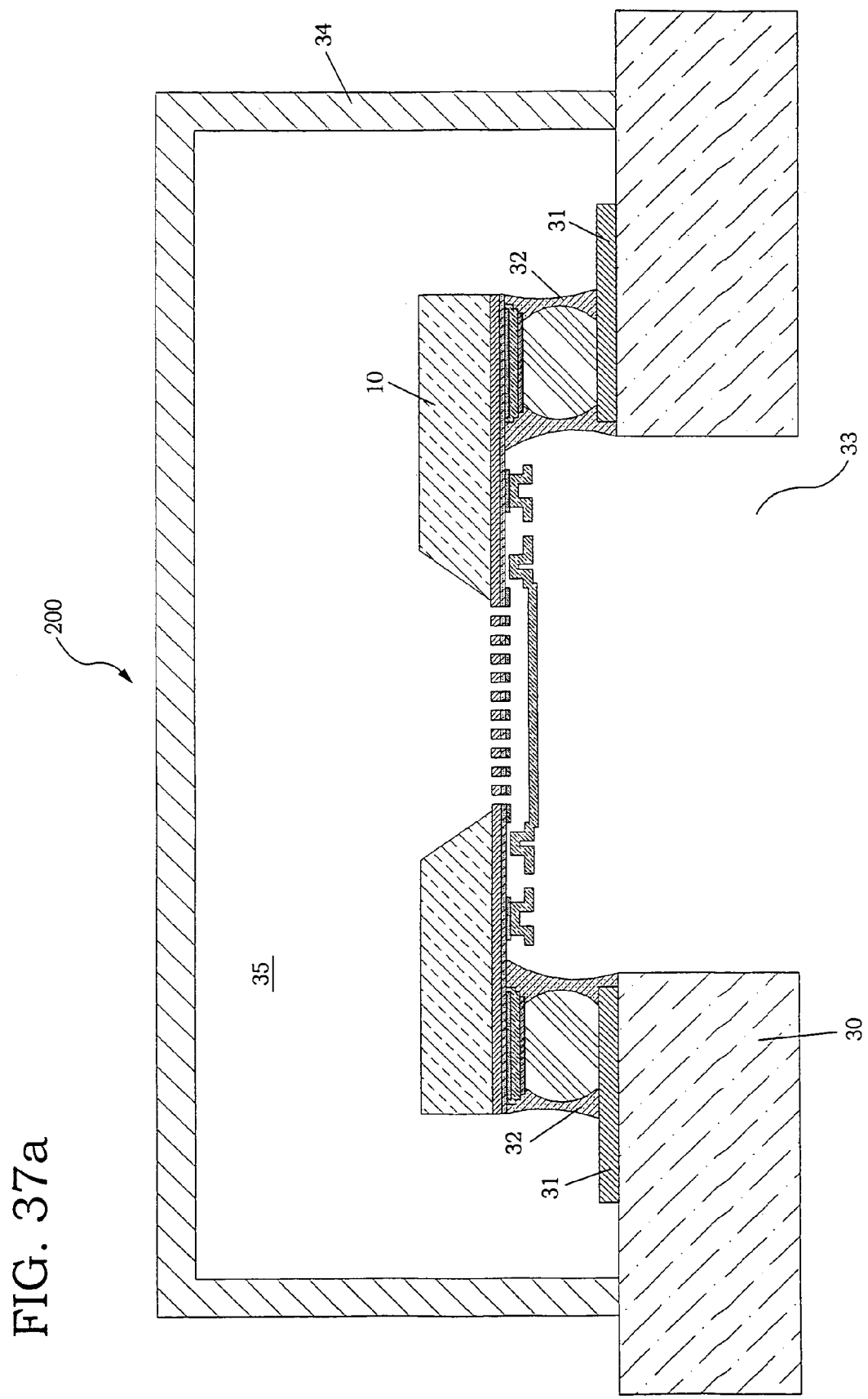
FIG. 37a is a cross-sectional view of a microphone structure assembled on to a package carrier substrate according to the present invention.

A particularly useful assembly 200 for mounting microphone structure 10, and 300 for mounting directional microphone structure 100, on a package carrier substrate 30 is shown in FIG. 37a-b. Electrical interconnection is realized using a conductive layer 31 deposited on carrier substrate 30. An under filling material, or sealant, 32 provides encapsulation of the electrical interconnection between microphone 10 or 100 and carrier substrate 30, as well as an acoustic seal between the front and back of the microphone structure. Capillary forces that cause the filling of the gap between microphone 10 or 100 and carrier substrate 30 with sealant 32, are controlled by providing an opening 33 in carrier substrate 30, which prevents sealant 32 from reaching the movable parts in microphone structure 10 or 100. The back volume 35 in the pressure type microphone is formed by attaching a hollow cap 34 to carrier substrate 30. Cap 34 is attached to carrier substrate 30, such that a hermetic/acoustic seal is achieved, such that the only acoustic leakage path to the back volume 35 is through a small opening made in the diaphragm within the microphone 10 or 100. This allows tight control of the lower roll-off frequency of the microphone.

Figure 38:
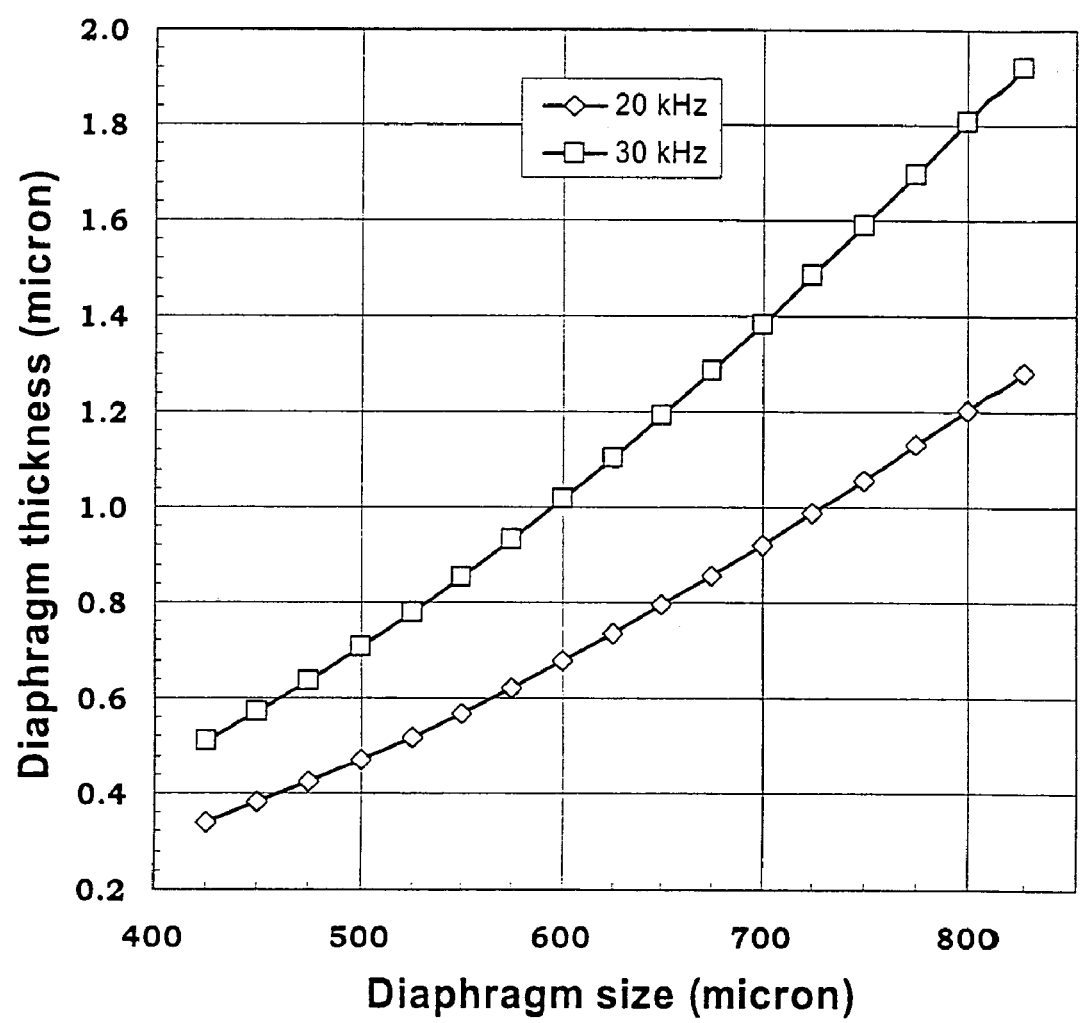
FIG. 38 is a graphic illustration of the first order relationship between diaphragm thickness and size for specific diaphragm resonance frequencies of 20 kHz and 30 kHz.

A number of simple physical relationships can be used to determine the correct dimensions of the microphone to the first order, the most important of which are diaphragm thickness, diaphragm size, and initial air gap between diaphragm and fixed counter electrode. These dimensions are chosen to satisfy important microphone specifications such as resonance frequency, sensitivity, and DC bias voltage. The first mode resonance frequency for a square diaphragm is given by:

$$f_{res} = \frac{h_d}{2\pi a_d^2} \sqrt{\frac{E_d}{0.01626(1-v_d^2)\rho_d}}.$$

where $h_d$ is the thickness, $\alpha_d$ is the side length, $E_d$ is Young's modulus, $v_d$ is Poisson's ratio, and $\rho_d$ is the density of the diaphragm. If, for instance, the microphone is designed for a resonance frequency of 20 kHz or 30 kHz, and polycrystalline silicon is being used as diaphragm material, the relationships shown in FIG. 38 between diaphragm thickness and size are obtained. The initial air gap required between the diaphragm 11 and the fixed counter electrode 21 is determined from the desired operating DC bias voltage and the diaphragm thickness and size relationship described above. The diaphragm 11 is attracted to the fixed counter electrode 21 due to the electrostatic field in the air gap 15, and an instability exists where the attraction force overcomes the diaphragm restoring force thereby causing a collapse of the structure 10. Assuming a piston motion of the diaphragm and a stiff fixed counter electrode, the bias voltage at which the collapse occurs is given by:

$$V_{collapse} = K_d \alpha_d h_\alpha^{3/2}.$$

The constant $K_d$ is determined from the relationship between diaphragm thickness and size. The following values apply for a polycrystalline silicon diaphragm:

| Resonance frequency | $K_d$ |
| --- | --- |
| 20 kHz | $1.51 * 10^{12}$ |
| 30 kHz | $2.78 * 10^{12}$ |

Figure 39:
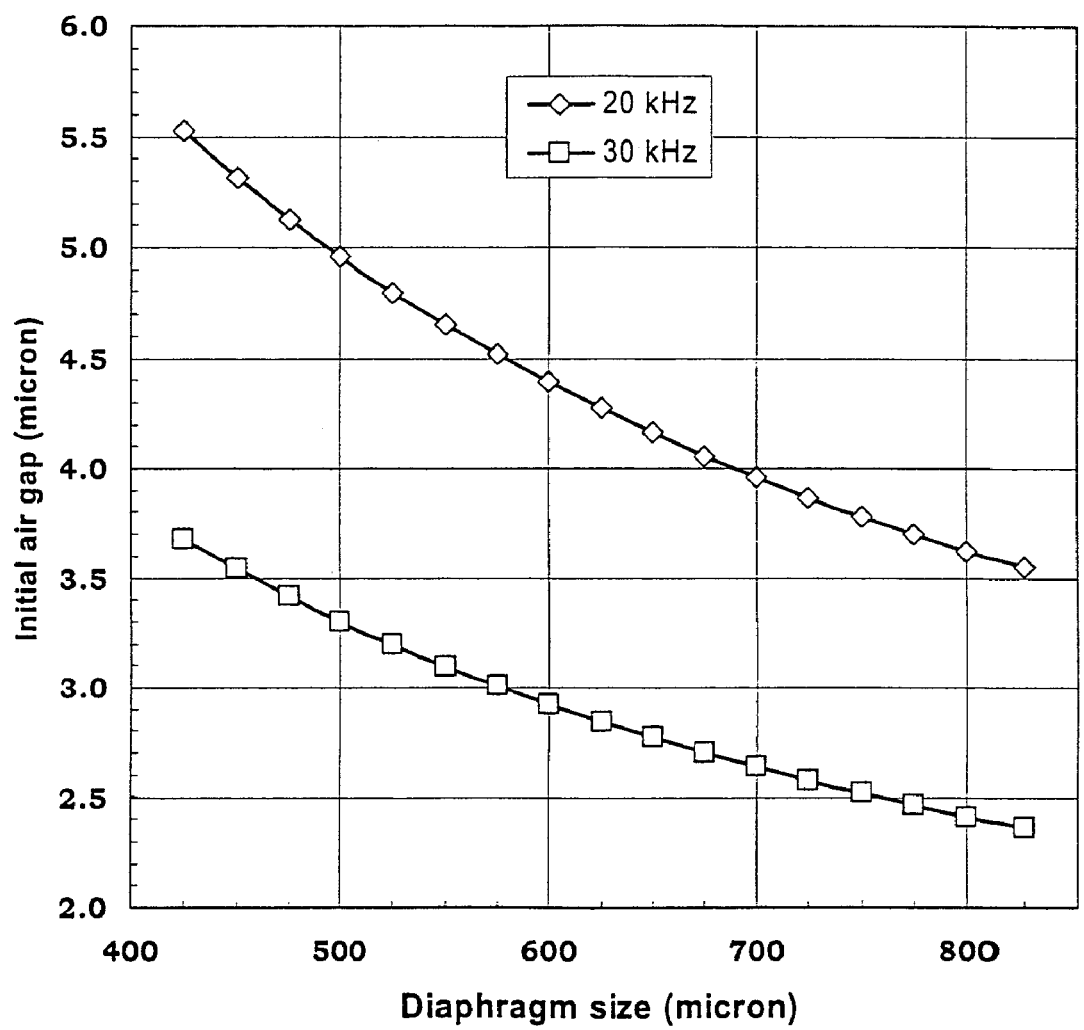
FIG. 39 is a graphic illustration of the first order relationship between initial air gap and diaphragm size for specific diaphragm resonance frequencies of 20 kHz and 30 kHz and a DC bias voltage of 5 V.
Figure 40:
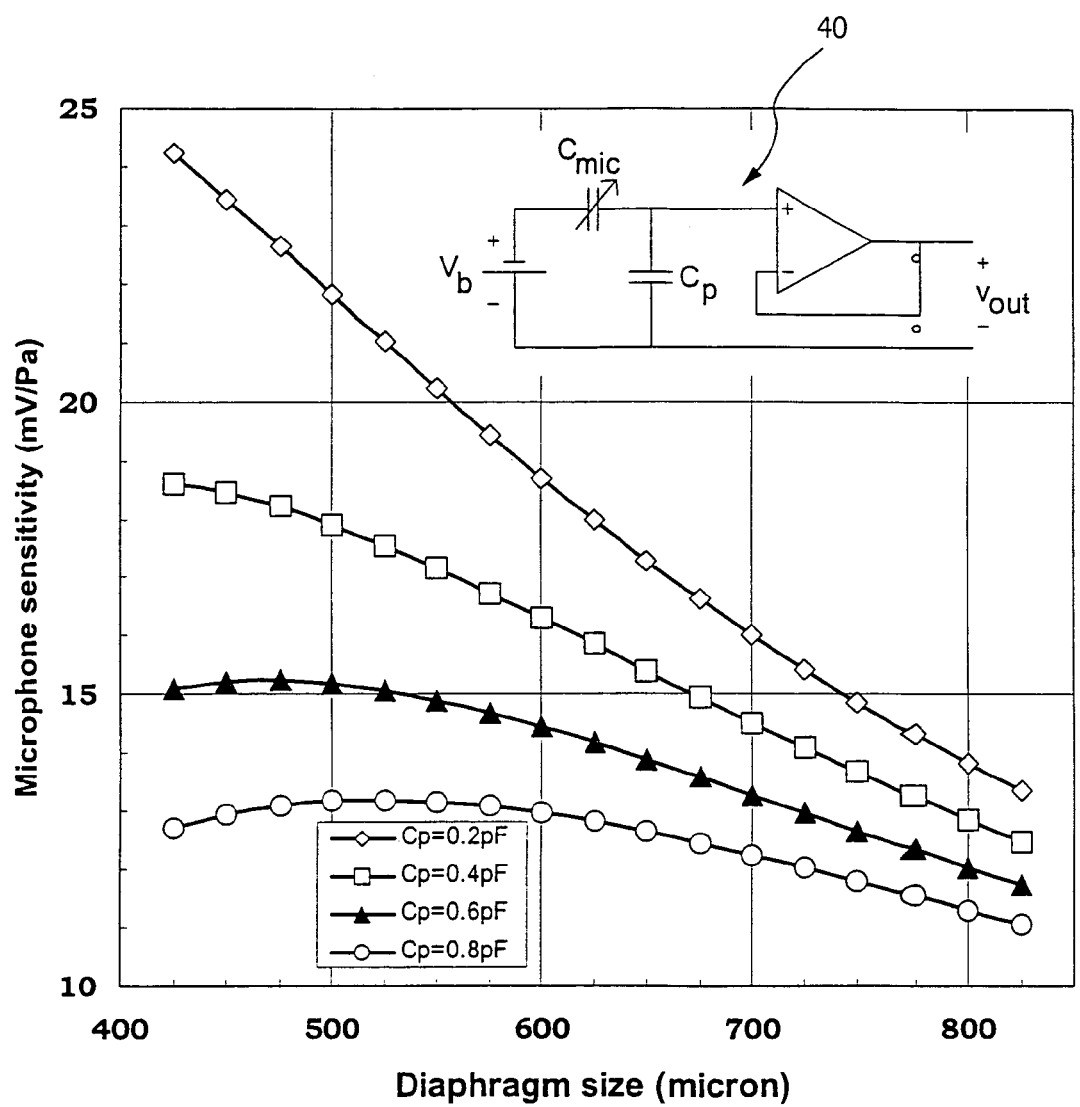
FIG. 40 is a graphic illustration of the first order relationship between microphone sensitivity and diaphragm size for certain parasitic capacitances associated with a buffer amplifier.

An empirical rule in condenser microphone design is to use a DC bias voltage, which is approximately 60% of the collapse voltage. Assuming a DC bias voltage of 5V yields the relationship between diaphragm size and initial air gap shown in FIG. 39. If the microphone 10 is operated with a buffer amplifier 40, as shown in FIG. 40, any parasitic capacitance between the diaphragm 11 and fixed counter electrode 21 in the microphone 10, in the connections to the amplifier 40, and in the amplifier itself must be considered in the design. In FIG. 40, the output sensitivity of a microphone 10, according to the design rules mentioned above, is shown as function of the diaphragm size and parasitic capacitance $C_p$. As can be seen, an optimum size exists for each value of the parasitic capacitance, which is caused by the counteraction of decreasing mechanical diaphragm sensitivity and increasing microphone source capacitance with increasing diaphragm size. The mechanical sensitivity of the diaphragm will decrease with increasing diaphragm size to maintain the relationship shown in, FIG. 38.

The dynamic behavior is largely determined by the natural first order resonance frequency of the diaphragm 11, the acoustic streaming resistance of air in the narrow gap 15 between the diaphragm and fixed counter electrode 21, and any acoustical leakage across the diaphragm 11. The streaming resistance, and associated damping, in the air gap 15 may be controlled closely by adding a number of openings 20 in the fixed electrode 21. The number of openings 20 and their location can be tuned to produce an upper corner frequency of the microphone 10 that coincides with the diaphragm resonance frequency to produce a flat frequency response with maximum bandwidth of the microphone. The lower corner frequency is controlled by adding one or more small openings in the diaphragm 11 or the annular indentation 12 to allow a controlled amount of air to bypass the diaphragm. It is thus possible to tightly control the lower corner frequency in a range from at least 300 Hz to less than 1 Hz.

Figure 41:
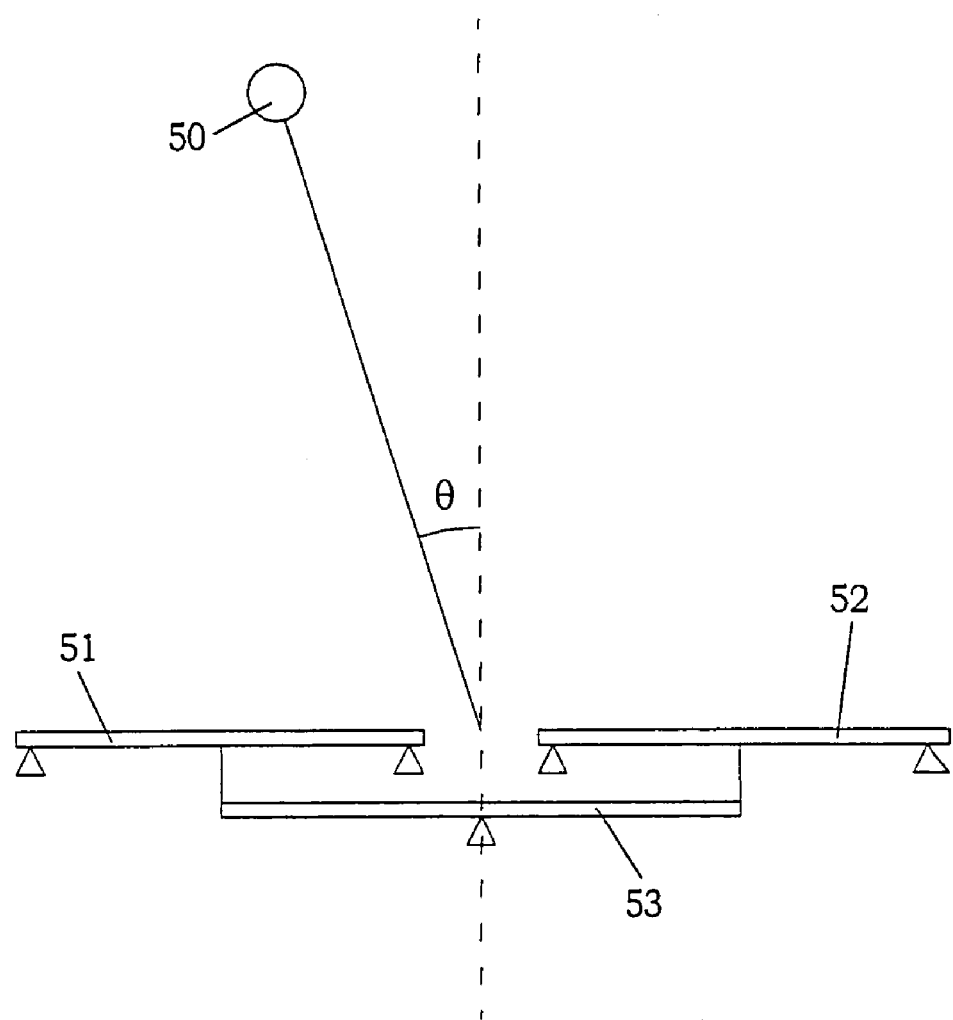
FIG. 41 is a conceptual diagram of a mechanical equivalent model for a directional microphone according to the present invention.
Figure 42A:
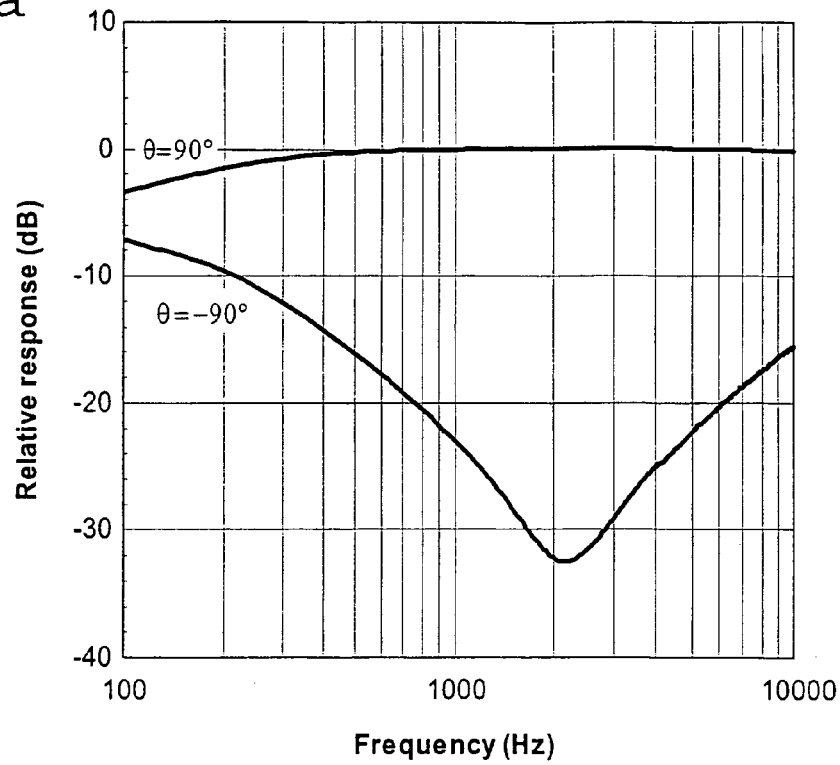
FIGS. 42a and 42b are graphic illustrations of the frequency and directional response curve of a directional microphone according to the present invention.
Figure 42B:
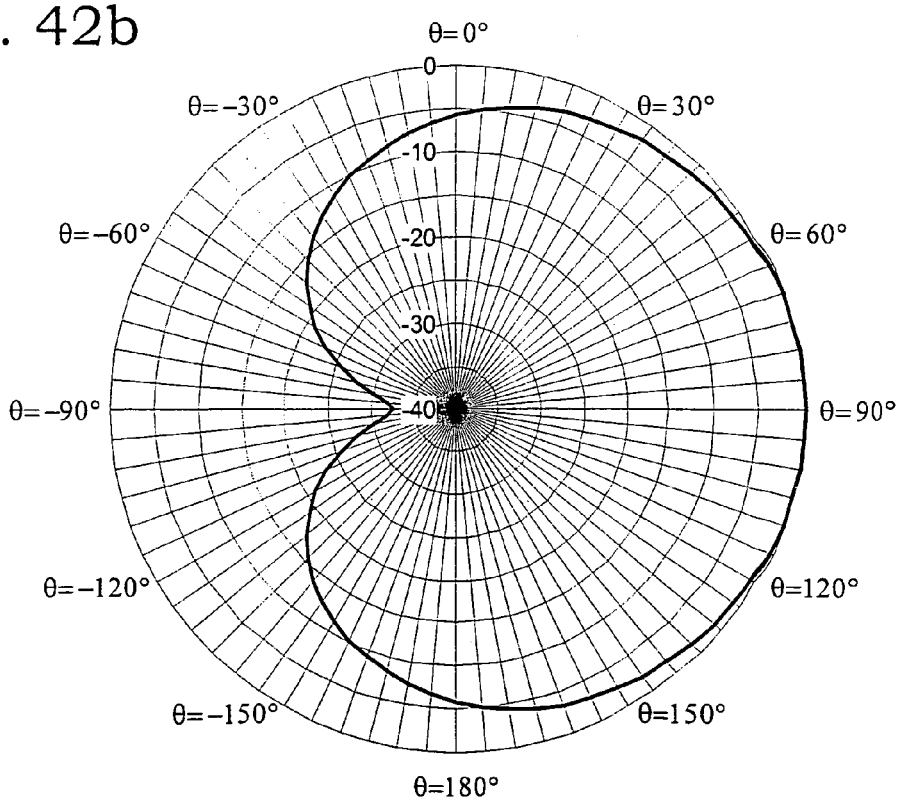

When two or more diaphragms 111 are combined with a mechanical coupling beam 140 to form a directional microphone 100, the coupled mechanical response at each diaphragm must be determined. For the particular preferred embodiment shown in FIG. 9-10, a conceptual mechanical diagram (see FIG. 41) can be used for the analysis, in which the two supported diaphragms 51 and 52 are attached to a centrally supported mechanical coupling beam 53, and where a sound source 50 is located at an angle θ off the principal axis of the microphone. It has been shown that the complex transfer functions for the deflection at the point of attachment to the mechanical coupling beam of each diaphragm can be approximated by:

$$H_{d1}(\omega) = \frac{(H_{f1}(\omega) - H_{f2}(\omega))/(2m)}{\omega_r^2 - \omega^2 + 2\omega_r\xi_r i\omega} + \frac{(H_{f1}(\omega) + H_{f2}(\omega))/(2m)}{\omega_t^2 - \omega^2 + 2\omega_t\xi_t i\omega},$$

$$H_{d2}(\omega) = \frac{(H_{f1}(\omega) + H_{f2}(\omega))/(2m)}{\omega_t^2 - \omega^2 + 2\omega_t\xi_t i\omega} - \frac{(H_{f1}(\omega) - H_{f2}(\omega))/(2m)}{\omega_r^2 - \omega^2 + 2\omega_r\xi_r i\omega}$$

where $\omega_r = \sqrt{k_d/m}$, $\omega_t = \sqrt{(k_d + 2k_b)/m}$, $\xi_r = c_d/(\omega_r m)$, $\xi_t = (c_d + 2c_b)/(\omega_t m)$ in which $k_d$ is the flexural stiffness of each diaphragm, $k_b$ is the flexural stiffness of the mechanical coupling beam, $c_d$ is the mechanical damping of each diaphragm, $c_b$ is the mechanical damping of the coupling beam, m is the mass of each diaphragm, and $H_{f1}(\omega)$ and $H_{f2}(\omega)$ are the sound pressure to force transfer functions for each diaphragm, which for harmonic sound pressures are defined by:

$$H_{f1}(\omega) = se^{i\omega\tau/2}, H_{f2}(\omega) = se^{-i\omega\tau/2}$$

where s is the area of each diaphragm, and τ is the time delay for the incident sound pressure between the two diaphragms given by:

$$\tau = d \sin(\theta)/c$$

where d is the separation between each diaphragm/beam attachment point, θ is the angle of incidence of the sound pressure wave as defined in FIG. 41, and c is the speed of sound in air (344 m/s). The equations above can be used with the mechanical stiffness and damping information for the diaphragms 111 and connecting beam 140 to maximize the directivity of the microphone 100 at a specific operating frequency. For maximum efficiency for human communication, it is useful to maximize the directivity of microphone 100 at 2.2 kHz, which is the peak of the frequency response of the human ear (as described by the A-weighting function). The frequency and directional response of diaphragm 51 (FIG. 41) for such an optimized design is shown in FIGS. 42a and 42b. As can be seen, the directional microphone has a cardioid response with a peak sensitivity at θ=90° and a minimum sensitivity at θ=−90°. The separation between incoming signals from these two positions is as high as 36 dB at 2.2 kHz and above 20 dB in the frequency range between 800 Hz and 6 kHz.

Although the present invention has been described in terms of particular embodiments and processes, it is not intended that the invention be limited to those disclosed embodiments and processes. Modifications of the embodiments and processes within the spirit of the invention will be apparent to those skilled in the art. The scope of the invention is defined by the claims that follow.

What is claimed is:

1. A directional acoustic transducer comprising:
a supporting substrate;
at least two electrodes formed in said substrate;
at least two movable diaphragms, each diaphragm being positioned over a corresponding electrode and including an indentation to maintain a fixed distance between said diaphragm and said diaphragm's corresponding electrode when a bias voltage is applied between said diaphragm and the corresponding electrode, each said electrode including a plurality of holes to allow air in a gap between the electrode and its corresponding diaphragm to escape, thereby reducing acoustical damping therein;
a plurality of suspension structures formed on the substrate and attached to the diaphragms to support the diaphragms, the suspension structures supporting each diaphragm having a restoring force equal to or greater than surface contact forces between said diaphragm supported by said suspension structures and the supporting substrate, whereby an electrostatic force associated with the bias voltage overcomes the restoring force of said suspension structures, causing the corresponding diaphragm to be pulled towards the supporting substrate; and
a support beam formed in the supporting substrate for providing a flexible mechanical coupling between said movable diaphragms, whereby the response of each diaphragm to incoming sound pressure waves not in phase with one another will be determined by the mechanical interaction between the diaphragms provided by the mechanical coupling beam.

2. The directional acoustic transducer according to claim 1 further comprising a plurality of metal pads formed on said supporting substrate to provide electrical connections to said diaphragms and said counter electrodes.

3. The directional acoustic transducer according to claim 1, wherein the indentations formed on the diaphragms are annular indentations.

4. The directional acoustic transducer according to claim 1, wherein the indentations formed on the diaphragms are of a shape that provides an acoustic seal between the front and back of each diaphragm when the electrostatic force causes said diaphragm to be pulled towards the supporting substrate to thereby enable a low frequency acoustical response of said diaphragm.

5. The directional acoustic transducer according to claim 3, wherein each diaphragm makes physical contact with the supporting substrate at said diaphragm's annular indentation to thereby set an operational air gap in the acoustic transducer.

6. The directional acoustic transducer according to claim 1, wherein when the electrostatic force causes each diaphragm to be pulled towards the supporting substrate an incident sound pressure wave produces a pressure differential over the diaphragm, causing it to deflect from its initial position and change an electrical capacitance between the diaphragm and the electrode.

7. The directional acoustic transducer according to claim 6 further comprising an electronic detection circuit for measuring the change in electrical capacitance between the diaphragm and electrode.

8. The directional acoustic transducer according to claim 7, wherein the electronic detection circuit is integrated onto the substrate.

9. The directional acoustic transducer according to claim 1, wherein thickness, diaphragm size, diaphragm material of each diaphragm and the selected distance between each diaphragm and its corresponding electrode are selected to meet selected transducer specifications of resonance frequency, sensitivity, bias voltage, and directivity.

10. The directional acoustic transducer according to claim 1, wherein the bias voltage is a DC bias voltage.

11. The directional acoustic transducer according to claim 10, wherein the DC bias voltage is approximately 60% of the diaphragm's collapse voltage.

12. The directional acoustic transducer according to claim 10, wherein the DC bias voltage is in the range of 1V to 20V DC.

13. The directional acoustic transducer according to claim 1 in which said supporting substrate is silicon.

14. The directional acoustic transducer according to claim 1 in which said supporting substrate includes pre-processed electronic circuits.

15. The directional acoustic transducer according to claim 1 in which each said electrode is made from one or more materials selected from the group consisting of silicon, silicon-germanium alloy, silicon nitride, and silicon dioxide.

16. The directional acoustic transducer according to claim 1 in which each said diaphragm is made from a material selected from the group consisting of polycrystalline silicon or silicon-germanium alloy.

17. The directional acoustic transducer according to claim 2 in which said metal pads are made from one or more materials selected from the group consisting of gold, titanium, tungsten, chromium, tin, nickel, silver, copper, aluminum, iron, palladium, lead and zinc.

18. The directional acoustic transducer according to claim 2, wherein a solder ball is formed on each metal pad to allow the use of flip-chip bonding for the assembly of the directional acoustic transducer supporting substrate into a package.

19. The directional acoustic transducer according to claim 1, wherein the number of holes in each electrode and their location are selected to produce an optimal directional response of the acoustic transducer in a selected frequency range.

20. The directional acoustic transducer according to claim 3, wherein each diaphragm or its corresponding annular indentation includes one or more openings to allow a controlled amount of air to bypass the diaphragm, whereby the lower corner frequency of the directional acoustic transducer is controlled to be in a range from at least 300 Hz to less than 1Hz.

21. The directional acoustic transducer according to claim 1, wherein each of the electrodes and the diaphragms are electrically conductive.

22. The directional acoustic transducer according to claim 1, wherein each of the electrodes is fixed.

23. The directional acoustic transducer according to claim 1 further comprising an assembly for mounting the directional acoustic transducer on a package carrier substrate, the assembly comprising:
a conductive layer deposited on the carrier substrate for electrical interconnection between the carrier substrate and the directional acoustic transducer;
an under filling material for providing encapsulation of the electrical interconnection and an acoustic seal between the front and back of the directional acoustic transducer; and a hollow cap attached to the carrier substrate, whereby a back volume is formed within the hollow cap and a hermetic/acoustic seal of the directional acoustic transducer is achieved so that the only acoustic leakage path to the back volume is through an opening made in the diaphragms to thereby control the lower roll-off frequency of the directional acoustic transducer.

24. The directional acoustic transducer according to claim 23, wherein the under filling material is a sealant.

25. The directional acoustic transducer according to claim 24, wherein capillary forces that cause the filling of a gap between the directional acoustic transducer and the carrier substrate are controlled by providing an opening in the carrier substrate which prevents the sealant from reaching the movable parts in the acoustic transducer.

26. A directional acoustic transducer comprising:
  supporting means;
  a plurality of means fixedly formed on the supporting means for conducting an electrical field;
  a plurality of means positioned over the fixed conducting means for conducting the electrical field and sensing acoustical pressure; each said sensing means including means for maintaining a selected distance between said sensing means and a corresponding said fixed conducting means when the electrical field is applied between the sensing means and the fixed conducting means;
  a plurality of means formed on the supporting means and attached to the sensing means to suspend and support the sensing means whereby intrinsic mechanical stress in said sensing means and imposed stress from said supporting means are eliminated, each of said suspension and support means having a restoring force equal to or greater than surface contact forces between corresponding sensing means and supporting means;
  means to provide electrical connections to said sensing means and fixed conducting means; and
  means for providing a flexible mechanical coupling between said plurality of sensing means, whereby the response of each sensing means to incoming sound pressure waves not in phase is determined by the mechanical interaction between the plurality of sensing means and the mechanical coupling means, and
  whereby an electrostatic force associated with the electric field overcomes the restoring force of each suspension means, causing the corresponding sensing means to be pulled towards the supporting means; and each said fixed conducting means includes means to allow air in a gap between each fixed conducting means and corresponding sensing means to escape, thereby reducing acoustical damping therein.

27. The directional acoustic transducer of claim 1, wherein the at least two electrodes formed in said substrate are electrically conductive, fixed counter electrodes, and wherein the at least two movable diaphragms are electrically conductive.

* * * * *